(12) United States Patent
Sarkar et al.

(10) Patent No.: US 10,289,778 B2
(45) Date of Patent: May 14, 2019

(54) SIMULATING ELECTRONIC CIRCUITS INCLUDING CHARGE PUMPS

(71) Applicant: SAMSUNG ELECTRONICS CO., LTD., Suwon-si, Gyeonggi-Do (KR)

(72) Inventors: Surojit Sarkar, Hwasung-Si (KR); Jong-Eun Koo, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 905 days.

(21) Appl. No.: 14/668,077

(22) Filed: Mar. 25, 2015

(65) Prior Publication Data

US 2016/0034622 A1 Feb. 4, 2016

(30) Foreign Application Priority Data

Jul. 31, 2014 (KR) .................. 10-2014-0098587

(51) Int. Cl.
*G06F 17/50* (2006.01)

(52) U.S. Cl.
CPC ................ *G06F 17/5036* (2013.01)

(58) Field of Classification Search
CPC .................................. G06F 17/5036
USPC ....................................... 703/13, 14
See application file for complete search history.

(56) References Cited

U.S. PATENT DOCUMENTS

| 6,704,908 | B1* | 3/2004 | Horan | G06F 17/5063 |
| | | | | 716/104 |
| 6,792,579 | B2 | 9/2004 | Rankin | |
| 7,076,415 | B1 | 7/2006 | Demler et al. | |
| 7,512,910 | B2 | 3/2009 | Liu | |
| 8,086,974 | B2 | 12/2011 | Feng | |
| 8,378,736 | B2 | 2/2013 | Burgener et al. | |
| 8,600,722 | B1 | 12/2013 | Chan et al. | |
| 2002/0114417 | A1 | 8/2002 | McDonagh | |
| 2003/0212973 | A1 | 11/2003 | Lin et al. | |
| 2009/0289726 | A1* | 11/2009 | Peng | H03L 7/0893 |
| | | | | 331/17 |
| 2011/0090998 | A1* | 4/2011 | Zhang | H03L 7/093 |
| | | | | 375/365 |
| 2013/0293284 | A1* | 11/2013 | Drost | H02M 3/073 |
| | | | | 327/536 |

FOREIGN PATENT DOCUMENTS

| CN | 101753011 | 6/2010 |
| CN | 203206110 | 9/2013 |

(Continued)

OTHER PUBLICATIONS

Starzyk et al. (A DC-DC Charge Pump Design based on Voltage Doublers, 2001 (10 pages)).*

(Continued)

*Primary Examiner* — Andre Pierre Louis
(74) *Attorney, Agent, or Firm* — F. Chau & Associates, LLC

(57) ABSTRACT

A method of simulating an electronic circuit including an N-stage charge pump includes generating a charge pump macro model corresponding to the N-stage charge pump, and simulating the charge pump macro model. The charge pump macro model includes an output terminal, a behavioral block defined by a modeling language, and a passive device block including at least one passive device connected to the output terminal and the behavioral block.

17 Claims, 21 Drawing Sheets

(56) References Cited

FOREIGN PATENT DOCUMENTS

| WO | 0145261 | 6/2001 |
|---|---|---|
| WO | 2013028956 | 2/2013 |

OTHER PUBLICATIONS

Palumbo et al., "Charge Pump Circuits: An Overview on Design Strategies and Topologies", IEEE Circuits and Systems Magazine, First Quarter 2010, pp. 31-45.

Pylarinos, Louie, and E. Roger, "Charge Pumps: An Overview", Department of Electrical and Computer Engineering, University of Toronto 7 (2003).

\* cited by examiner

```
1    module vmult (out);  //Only a one-terminal module
2
3    output out;
4    voltage out;
5
6    real set;
7
8    parameter real N=6;
9    // This value can change depending upon the original N-Stage Charge-
10   //Pump. This 'N' value is same as the N-Stage Charge-Pump 'N' value.
11   parameter real evc=1.5;
12
13   analog begin
14
15   set = evc * N;
16
17   V(out) <+ transition(set);
18
19   end
20
21   endmodule
```

FIG. 8

```
1    module filter(in,out);
2
3    input in;
4    output out;
5
6    electrical out, in;
7
8    real vout;
9
10   analog begin
11
12   @(above (V(in) − 0.5)) vout=1.0; // Converting to Analog 1.0V
13   @(above (0.5 − V(in))) vout=0.0; // Converting to Analog 0.0V
14
15   V(out) <+ transition(vout,50p);
16
17   end
18
19   endmodule
```

```
1     module switch(a,b,en);
2
3     input a, en;
4     output b;
5
6     electrical a, b, en;
7
8     real gon=0.01;
9     real goff=0.0;
10    real geff;
11
12    analog begin
13
14    if (V(en)==1.0)
15
16          geff=gon;  //ON
17
18    else  geff=goff; //OFF
19
20
21    I(a,b) <+ V(a,b)*geff;
22
23    end
24
25    endmodule
```

FIG. 10

```
1    `include "disciplines.vams"
2    `include "constants.vams"
3
4    module CP (en , vout);
5
6    input en;
7    output out;
8
9    voltage en, vout;
10   electrical clk_d,out1,out2; // Internal Nodes
11
12   ground gnd;
13
14   parameter real N=6;
15   parameter real Req=13.173k;
16   parameter real Cadj=90p;
17
18   filter  filter1(en, clk_d);  // Instance of filter
19   vmult #(.N(N) vmult1(out1);  // Instance of Voltage-Multiplier
20   switch switch1(out1,out2,clk_d);  // Instance of switch
21   resistor #(.r(Rpmp)) R_EQ (out2, vout);   // Instance of resistor
22   capacitor #(.c(Cadj)) C_ADJ (vout, gnd);  // Instance of Capacitor
23
29   endmodule
```

FIG. 15

| Operation | Run-Time with original CP scheme (hours) | Run-Time with transient model (hours) |
|---|---|---|
| Read | 24.55 | 10.13 |
| Program | 78.46 | 33.5 |
| Erase | 194.5 | 113.7 |

SIMULATING ELECTRONIC CIRCUITS INCLUDING CHARGE PUMPS

CROSS-REFERENCE TO RELATED APPLICATIONS

This application claims priority under 35 U.S.C. § 119 to Korean Patent Application No. 10-2014-0098587, filed on Jul. 31, 2014, the disclosure of which is incorporated by reference herein in its entirety.

TECHNICAL FIELD

Exemplary embodiments of the present inventive concept relate to a method of simulating an electronic circuit, and more particularly, to a method of simulating an electronic circuit including a charge pump, a non-transitory computer-readable storage medium configured to store a plurality of commands for executing the method, and a computer system including the storage medium and a processor configured to perform the plurality of commands.

DISCUSSION OF THE RELATED ART

Electronic circuit simulation tools (e.g., electronic circuit simulators) may provide results obtained by simulating operations of an electronic circuit to a designer, and enable the designer to confirm arbitrary design errors and modify the design of the electronic circuit before deciding upon a final design of the electronic circuit. This repetitive designing process may improve the reliability of a final product including the electronic circuit and reduce the cost of designing the electronic circuit. A simulation program with integrated circuit emphasis (SPICE) is one of the most commonly used electronic circuit simulation tools.

To obtain more precise simulation results, an electronic circuit simulation tool may perform simulations for a longer duration of time. For example, in the case of a large-sized electronic circuit (e.g., an electronic circuit including a large number of elements or an electronic circuit having a complicated connection scheme between elements), an electronic circuit simulation tool may perform simulations for a very long duration of time (e.g., for several tens of hours or several days). Further, when transitions of signals occur more frequently (e.g., when more events occur) in the same electronic circuit, the time taken for the electronic circuit simulation tool to simulate the electronic circuit may increase. As the time taken for the electronic circuit simulation tool to perform simulations increases, the time taken for a repetitive designing process may also increase until the final design of the electronic circuit is obtained. Thus, the cost of completing a final product may increase.

SUMMARY

Exemplary embodiments of the inventive concept provide a method of simulating an electronic circuit. For example, exemplary embodiments provide a method of simulating an electronic circuit including a charge pump at high speed, a non-transitory computer-readable storage medium configured to store a plurality of commands for executing the method, and a computer system including the storage medium and a processor configured to perform a plurality of commands corresponding to the method.

According to an exemplary embodiment of the inventive concept, a method of simulating an electronic circuit including an N-stage charge pump includes generating a charge pump macro model corresponding to the N-stage charge pump, and simulating the charge pump macro model. The charge pump macro model includes an output terminal, a behavioral block defined by a modeling language, and a passive device block including at least one passive device connected to the output terminal and the behavioral block.

The simulation of the charge pump macro model may include simulating the behavioral block based on the modeling language, and simulating the output terminal based on output of the behavioral block and values of at least one passive device.

The modeling language may be of VHDL-AMS, Verilog-AMS, or Verilog-A.

The charge pump macro model may further include an enable terminal. The behavioral block may include a voltage multiplier configured to generate a second voltage that is N times as high as a first voltage corresponding to an input voltage of the N-stage charge pump, and a switching unit configured to connect the voltage multiplier with the passive device block or disconnect the voltage multiplier from the passive device block in response to a control signal received through the enable terminal.

The switching unit may include a filter configured to filter the control signal, and a switch configured to connect the voltage multiplier with the passive device block or disconnect the voltage multiplier from the passive device block in response to the filtered signal.

The electronic circuit may include a regulator configured to generate a feedback signal for controlling the charge pump macro model based on a reference voltage and the output voltage from the output terminal of the charge pump macro model. The feedback signal may be applied to the enable terminal of the charge pump macro model.

The passive device block may include an equivalent resistor having one end connected to the output terminal and another end to which the output of the behavioral block is applied, and an adjustable capacitor connected between the output terminal and a ground voltage.

The generation of the charge pump macro model may include determining the resistance of the equivalent resistor based on the frequency of the clock signal input to the original N-stage charge pump and the capacitance value of a pumping-capacitor included in a single stage of the original N-stage charge pump.

When 'a' is larger than 0 and equal to or less than 1, the resistance of the equivalent resistor may be determined by the following equation: Req=(a×N)/(2f×C).

The generation of the charge pump macro model may also include determining the capacitance of an adjustment capacitor based on how well the rise or fall time of the voltage output of the charge pump macro model matches that of the original N-Stage charge pump.

The generation of the charge pump macro model may include determining the capacitance of the adjustment capacitor based on a capacitance of a capacitor included in a single stage of the N-stage charge pump.

The capacitance of the adjustment capacitor may be determined by the Equation: Cadj=(N×C)/3.

The method may further include comparing result data obtained by simulating the charge pump macro model with result data obtained by simulating the N-stage charge pump, and adjusting the capacitance of the adjustment capacitor based on the comparison result.

The generation of the charge pump macro model may include receiving, from a user, the number of stages of the N-stage charge pump, the frequency of the clock signal input to the N-stage charge pump, and the capacitance of a pumping capacitor included inside the original single-stage transistor-based charge pump circuit.

The electronic circuit may be a non-volatile memory device including at least one N-stage charge pump.

According to an exemplary embodiment of the inventive concept, a non-transitory computer-readable storage medium is configured to store a plurality of commands for executing a method of simulating an electronic circuit including an N-stage charge pump.

According to an exemplary embodiment of the inventive concept, a computer system includes a processor, and a non-transitory computer-readable storage medium configured to store a plurality of commands to be performed by the processor, the plurality of commands for executing a method of simulating an electronic circuit including an N-stage charge pump.

According to an exemplary embodiment of the inventive concept, a method of simulating an electronic circuit including an N-stage charge pump includes generating a charge pump macro model corresponding to the N-stage charge pump. The charge pump macro model includes an enable terminal and an output terminal, an adjustment capacitor connected between the output terminal and a ground voltage, an equivalent resistor having a first end connected to the output terminal, a voltage multiplier configured to generate a second voltage which is N times as high as the first voltage corresponding to an input voltage of the N-stage charge pump, and a switching unit configured to connect the voltage multiplier with the second end of the equivalent resistor or disconnect the voltage multiplier from the second stage including the equivalent resistor in response to the control signal received through the enable terminal.

The generation of the charge pump macro model may include defining operations of the voltage multiplier and the switching unit using a modeling language.

The method of simulating the electronic circuit including the N-stage charge pump may include simulating the voltage multiplier and the switching unit based on the modeling language, and simulating the output terminal based on the output of the switching unit, a resistance of the equivalent resistor, and a capacitance of the adjustment capacitor.

According to an exemplary embodiment of the inventive concept, a computer system for simulating an electronic circuit including an N-stage charge pump includes a peripheral device including an input device for receiving data from a user and an output device for providing simulation result data to the user, a memory storing information including a program routine(s), and a processor coupled to the peripheral device and the memory for controlling the execution of the program routine(s). The program routine(s) include determining values of an equivalent resistor and an adjustment capacitor based on the data, and generating a charge pump macro model including the equivalent resistor and the adjustment capacitor by using a modeling language.

An exemplary embodiment of the inventive concept provides a computer program product for a method of simulating an electronic circuit including an N-stage charge pump, the computer program product including a non-transitory computer-readable storage medium having program instructions embodied therewith, the program instructions executable by a processor to cause the processor to generate a charge pump macro model corresponding to the N-stage charge pump, and simulate the charge pump macro model. The charge pump macro model includes an output terminal, a behavioral block defined by a modeling language, and a passive device block comprising at least one passive device connected to the output terminal and the behavioral block.

According to an exemplary embodiment of the inventive concept, a computer system includes a processor and a memory. The memory is configured to store program instructions executable by the processor to cause the processor to simulate an electronic circuit including an N-stage charge pump by generating a charge pump macro model corresponding to the N-stage charge pump, and simulating the charge pump macro model. The charge pump macro model includes an output terminal, a behavioral block defined by a modeling language, and a passive device block including at least one passive device connected to the output terminal and the behavioral block.

According to an exemplary embodiment of the inventive concept, a computer system for simulating an electronic circuit including an N-stage charge pump includes an input device configured to receive input data from a user, an output device configured to provide simulation result data to the user, and a memory configured to store program instructions to determine a value of an equivalent resistor and a value of an adjustment capacitor based on the input data, and generate a charge pump macro model including the equivalent resistor and the adjustment capacitor by using a modeling language. The computer system further includes a processor coupled to the input device, the output device, and the memory. The processor is configured to control an execution of the program instructions.

According to an exemplary embodiment of the inventive concept, a computer system includes a processor and a memory. The memory is configured to store program instructions executable by the processor to cause the processor to simulate an electronic circuit including an N-stage charge pump by generating a charge pump macro model corresponding to the N-stage charge pump. The charge pump macro model includes an enable terminal, an output terminal, an adjustment capacitor connected between the output terminal and a ground voltage, an equivalent resistor having a first end connected to the output terminal, a voltage multiplier configured to generate a second voltage that is N times as high as a first voltage corresponding to an input voltage of the N-stage charge pump, and a switching unit configured to connect the voltage multiplier to a second end of the equivalent resistor or disconnect the voltage multiplier from the second end of the equivalent resistor in response to a control signal received through the enable terminal.

BRIEF DESCRIPTION OF THE DRAWINGS

The above and other features of the present inventive concept will become more apparent by describing in detail exemplary embodiments thereof with reference to the accompanying drawings, in which:

FIGS. 8 and 9 respectively illustrate examples of pseudocode corresponding to a filter and a switch that are included in the switching unit of FIG. 6 and defined using a modeling language according to exemplary embodiments of the inventive concept.

FIG. 10 illustrates an example of a charge pump macro model of FIG. 6, which is defined using a modeling language according to exemplary embodiments of the inventive concept.

FIG. 15 illustrates a simulation time that is reduced by performing a full-chip simulation using a charge pump model as a charge pump macro model according to exemplary embodiments of the inventive concept.

DETAILED DESCRIPTION OF THE EXEMPLARY EMBODIMENTS

Figure 1:
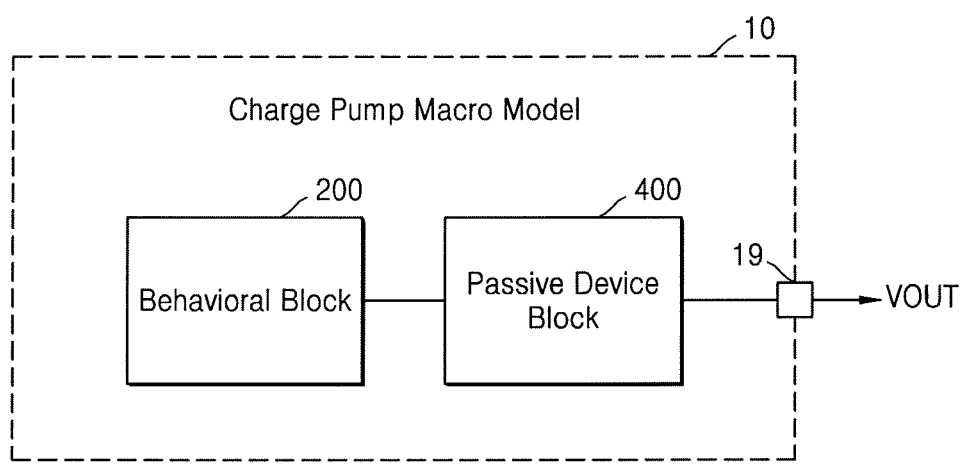
FIG. 1 is a schematic diagram of a charge pump macro model generated to simulate an original charge pump according to exemplary embodiments of the inventive concept.

Exemplary embodiments of the present inventive concept will be described more fully hereinafter with reference to the accompanying drawings. Like reference numerals may refer to like elements throughout the accompanying drawings. In the drawings, the thicknesses of layers and regions may be exaggerated for clarity.

A charge pump (or charge pump circuit) refers to an electronic circuit configured to output a direct-current (DC) voltage, which is several times as high as a power supply voltage. Unlike a DC-DC converter adopting an inductor, the charge pump may include a capacitor and a switch (or diode). Thus, the charge pump may be integrated on silicon. The charge pump may be included in applications (e.g., smart power integrated circuits (ICs) and non-volatile memory devices) that utilize higher voltages than a power supply voltage. For example, when data is written to, or erased or read from memory cells of a non-volatile memory device, such as a flash memory device, the non-volatile memory device may operate using higher voltages than a power supply voltage supplied to the non-volatile memory device. At least one charge pump included in the non-volatile memory device may generate the higher voltages than the power supply voltage.

FIG. 1 is a schematic diagram of a charge pump macro model generated to simulate an original charge pump according to exemplary embodiments of the inventive concept. As shown in FIG. 1, a charge pump macro model 10 according to exemplary embodiments of the inventive concept may include an output terminal 19. The charge pump macro model 10 may be connected to an external circuit through the output terminal 19. The charge pump macro model 10 may include a behavioral block 200 and a passive device block 400.

The behavioral block 200 may be a block defined by a modeling language defining operations of an analog or mixed-signal system. For example, the behavioral block 200 may be defined by a modeling language including Very High Speed Integrated Circuits Hardware Description Language-Analog Mixed Signal (VHDL-AMS), Verilog-AMS, or Verilog-A. A relationship between a signal input to the behavioral block 200 and a signal generated and output by the behavioral block 200 may be defined based on operations of the behavioral block 200 described by a modeling language. An electronic circuit simulator may determine states of signals, which may interface with the behavioral block 200, based on the behavioral block 200 defined by the modeling language, for example, by compiling the modeling language defining the behavioral block 200.

The passive device block 400 may include at least one passive device such as, for example, a resistor or a capacitor. The passive device block 400 may be disposed between the behavioral block 200 and the output terminal 19 of the charge pump macro model 10. A passive device may refer to a device that is capable of consuming, accumulating, or emitting supplied power and does not serve active functions, such as, for example, amplification or rectification. In contrast, an active device may refer to a device configured to operate using supplied power to create a predetermined relationship between an input signal and an output signal, and may include, for example, an operational amplifier, a transistor, or a vacuum tube. The electronic circuit simulator may determine states of signals, which may interface with the passive device, based on characteristics of the passive device and at least one value (e.g., resistance or capacitance) of the passive device.

The charge pump macro model 10 including the behavioral block 200 and the passive device block 400 according to exemplary embodiments of the inventive concept allows the electronic circuit simulator to generate simulation result data approximate to simulation result data of an original charge pump including a plurality of active devices and a plurality of passive devices. As a result, the time taken for simulations may be reduced due to a reduction in the amount of operations performed by the electronic circuit simulator during a simulation process.

Figure 2:
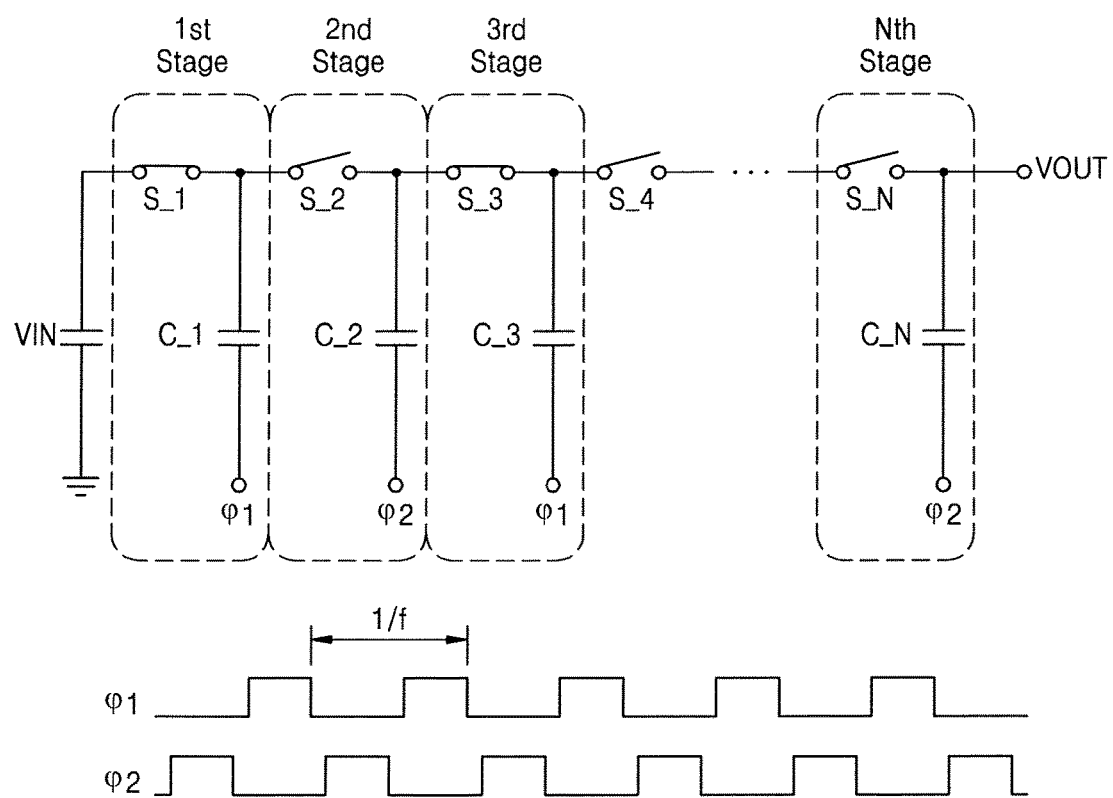
FIG. 2 is a schematic diagram showing operations of a charge pump according to exemplary embodiments of the inventive concept.

FIG. 2 is a schematic diagram showing operations of a charge pump according to exemplary embodiments of the inventive concept. As described above, the charge pump may generate an output voltage VOUT, which is several times as high as a received input voltage VIN (e.g., a power supply voltage VDD). The charge pump may include a plurality of stages used to generate a desired output voltage VOUT. For example, as shown in FIG. 2, the charge pump may include N stages (where N is an integer greater than or equal to 1). The charge pump may be referred to as an N-stage charge pump. Hereinafter, a charge pump including N stages will be described as an example of the charge pump, however, exemplary embodiments of the inventive concept are not limited thereto.

Each of the stages of the charge pump may include a switch $S\_1$, $S\_2$, ... $S\_N$, and a capacitor $C\_1$, $C\_2$, ... $C\_N$. Switches $S\_1$, $S\_3$, ... included in odd-numbered stages of the charge pump may be controlled to be opened and closed at the same points in time. Similarly, switches $S\_2$, $S\_4$, ... included in even-numbered stages of the charge pump may be controlled to be opened and closed at the same points in time. The capacitors $C\_1$, $C\_2$, ... $C\_N$ may store received charges and may transmit the stored charges, and may have the same capacitance.

The charge pump may use clock signals $\varphi 1$ and $\varphi 2$ having different phases. As shown in FIG. 2, the first clock signal $\varphi 1$ and the second clock signal $\varphi 2$ may have a frequency 'f' (e.g., a period of 1/f) and may have different phases (e.g., a phase difference of 180 degrees). As shown in FIG. 2, the first clock signal $\varphi 1$ may be applied to one end of the capacitors $C\_1$, $C\_3$, ... included in odd-numbered stages of the charge pump, and the second clock signal $\varphi 2$ may be applied to one end of the capacitors $C\_2$, $C\_4$, included in even-numbered stages of the charge pump.

While the first clock signal $\varphi 1$ is in a low state (e.g., a ground state) and the second clock signal $\varphi 2$ is in a high state, the switches $S\_1$, $S\_3$, ... included in the odd-numbered stages of the charge pump may be closed. In this case, the capacitor $C\_1$ included in a first stage of the charge pump may be charged with an input voltage VIN, and the capacitors $C\_3$, $C\_5$, ... included in other odd-numbered stages of the charge pump may receive charges from the capacitors $C\_2$, $C\_4$, ... included in the previous stages of the charge pump.

Subsequently, while the first clock signal $\varphi 1$ is in a high state (e.g., a power supply voltage) and the second clock signal $\varphi 2$ is in a low state, the switches $S\_2$, $S\_4$, ... included in the even-numbered stages of the charge pump may be closed. In this case, all capacitors $C\_1$, $C\_3$, ... included in the odd-numbered stages of the charge pump may transmit charges to the capacitors $C\_2$, $C\_4$, ... included in the next stages. Thus, charges may be transmitted from a node of the input voltage VIN to a node of the output voltage VOUT during a period of each clock signal. A direction in which charges move from the first stage to an N-th stage may be determined by the first and second clock signals $\varphi 1$ and $\varphi 2$ and operations of the switches $S\_1$, $S\_2$, .... When the input voltage VIN is a power supply voltage VDD, and a low state and a high state of the first and second clock signals $\varphi 1$ and $\varphi 2$ are a ground and the power supply voltage VDD, respectively, the output voltage VOUT of the charge pump in a steady state may approximate a voltage that is N times as high as the power supply voltage VDD (VOUT $\approx$ N×VDD).

In addition to the operations of the charge pump as illustrated in FIG. 2, exemplary embodiments of the inventive concept further provide additional various configurations of the charge pump. For example, according to exemplary embodiments, each of the switches $S\_1$, $S\_2$, ... of the charge pump of FIG. 2 may be embodied using a diode or at least one transistor. Further, both the first and second clock signals $\varphi 1$ and $\varphi 2$ may be applied to a single stage, which may increase the efficiency of the charge pump.

To simulate operations of a charge pump, a designer may prepare input data (e.g., a schematic circuit diagram or a netlist) corresponding to a configuration of the charge pump, and simulate the charge pump using an electronic circuit simulator. As described above, the charge pump may include a plurality of active devices and/or passive devices depending on configurations thereof. Thus, the electronic circuit simulator may perform simulations of the charge pump on each of the active devices and/or the passive devices included in the charge pump with reference to characteristics previously defined (e.g., in a library). In this case, as the number of the active devices and/or passive devices included in the charge pump increases and as connections between the respective devices become more complex, the time taken for the electronic circuit simulator to perform the simulations of the charge pump may increase.

Further, as transitions of signals occur more frequently in the same electronic circuit, the time taken for the electronic circuit simulator to perform the simulations of the electronic circuit may increase. Thus, as periods (1/f) of the first and second clock signals $\varphi 1$ and $\varphi 2$ applied to the charge pump decrease (e.g., as the frequency 'f' increases), the simulation time may increase. That is, the electronic circuit simulator may perform operations for deriving simulation result data in response to events that occur each time the first and second clock signals $\varphi 1$ and $\varphi 2$ make upward and downward transitions during one period 1/f. For example, a frequency 'f' of the first and second clock signals $\varphi 1$ and $\varphi 2$ applied to an arbitrary charge pump may be several tens of MHz, and the first and second clock signals $\varphi 1$ and $\varphi 2$ having such a high frequency 'f' may be one of the factors in increasing the simulation time.

According to exemplary embodiments, the charge pump macro model 10 of FIG. 1 according to exemplary embodiments of the inventive concept may not be limited by various feasible configurations of the charge pump, and may enable the electronic circuit simulator to simulate operations of the charge pump in a relatively small amount of time. Referring to the charge pump macro model 10 shown in FIG. 1, since the charge pump macro model 10 includes the behavioral block 200 defined by a modeling language, and the passive device block 400 including at least one passive device, the electronic circuit simulator may simulate the charge pump macro model 10 in a smaller amount of time than an original charge pump corresponding to an actual circuit including large numbers of active and passive devices.

In addition, as shown in FIG. 1, since the charge pump macro model 10 does not receive the first and second clock signals $\varphi 1$ and $\varphi 2$, the simulation time may be prevented from increasing as the frequency 'f' of the first and second clock signals $\varphi 1$ and $\varphi 2$ increases. That is, since the charge pump macro model 10 does not use a clock signal, such as the first or second clock signals $\varphi 1$ and $\varphi 2$, the charge pump macro model 10 may prevent an increase in the simulation time, which may be caused by frequent changes in clock signals. The simulation of the charge pump using the charge pump macro model 10 according to exemplary embodiments of the inventive concept may maintain the precision of simulation result data at a predetermined level, as described below with reference to FIGS. 16 through 18, and may significantly reduce the simulation time. For example, when a larger electronic circuit including a charge pump (e.g., smart power ICs or the entire circuit of a non-volatile memory device) is simulated (this case may be referred to as a full-chip simulation), the simulation of the charge pump using the charge pump macro model according to exemplary embodiments of the inventive concept may contribute to a significant reduction in the total simulation time.

Figure 3:
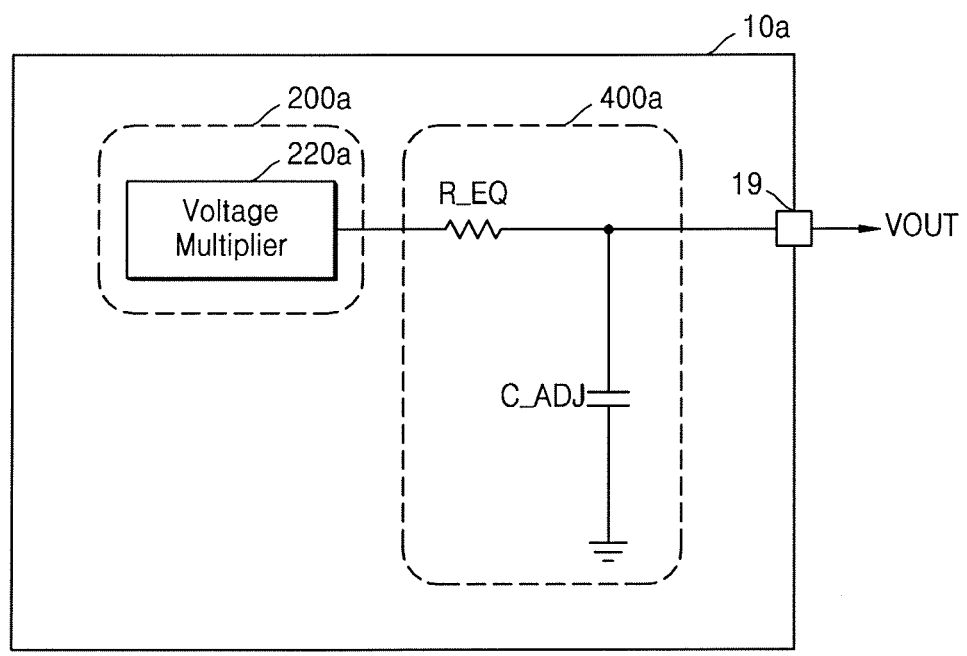
FIG. 3 is a schematic diagram of a charge pump macro model generated to simulate an original charge pump according to exemplary embodiments of the inventive concept.

FIG. 3 is a schematic diagram of a charge pump macro model generated to simulate an original charge pump according to exemplary embodiments of the inventive concept. Similar to the charge pump macro model 10 shown in FIG. 1, the charge pump macro model 10a of FIG. 3 may include an output terminal 19, a behavioral block 200a, and a passive device block 400a. The charge pump macro model 10a may generate an output voltage VOUT and transmit the output voltage VOUT through the output terminal 19.

As shown in FIG. 3, the behavioral block 200a may include a voltage multiplier 220a, which may be connected to the passive device block 400a. According to exemplary embodiments of the inventive concept, the voltage multiplier 220a may be defined by a modeling language and may generate a second voltage, which is N times as high as the first voltage. The first voltage may correspond to an input voltage of the original charge pump. The value of the first voltage may be provided by the user. For example, as shown in FIG. 3, the voltage multiplier 220a may generate a voltage, which is N times as high as the input voltage of the original charge pump, and may transmit the generated voltage to the passive device block 400a. As shown in the example illustrated in FIG. 4, since operations of the voltage multiplier 220a defined by the modeling language are relatively simple, the cost of an electronic circuit simulator to simulate operations of the voltage multiplier 220a included in the behavioral block 200a (e.g., a simulation run-time and a storage space needed to dump resultant waveforms) may be smaller than when the original charge pump is simulated.

Referring again to FIG. 3, the passive device block 400a may include an equivalent resistor R_EQ and an adjustment capacitor C_ADJ. The equivalent resistor R_EQ terminals may be respectively connected to the voltage multiplier 220a of the behavioral block 200a and the output terminal 19 of the charge pump macro model 10a. The ends of the adjustment capacitor C_ADJ may be respectively connected to a ground and the output terminal 19 of the charge pump macro model 10a. The electronic circuit simulator may simulate operations of the passive device block 400a based on a resistance Req of the equivalent resistor R_EQ and a capacitance Cadj of the adjustment capacitor C_ADJ.

According to exemplary embodiments of the inventive concept, the resistance Req of the equivalent resistor R_EQ may be determined based on the frequency 'f' of the clock signals (e.g., the first and second clock signals φ1 and φ2 of FIG. 2) received by the original charge pump, the capacitances C of pumping capacitors (e.g., the capacitors C_1, C_2, ... C_N of FIG. 2) included in respective stages of the original charge pump, and the value of N in the original N-stage charge pump. The frequencies 'f' and the capacitances C may be values derived from the original charge pump, and the resistance Req of the equivalent resistor R_EQ included in the passive device block 400a of the charge pump macro model 10a may be determined based on frequencies 'f' and capacitances C, which may be provided by a designer. For example, according to an exemplary embodiment, the resistance Req of the equivalent resistor R_EQ may be determined by Equation 1:

$$\text{Req} = (a \times N)/(2f \times C). \qquad \text{Equation 1:}$$

Referring to Equation 1, a may be a constant that is larger than 0 and equal to or less than 1, and that reflects parasitic factors and leakage elements of an actual charge pump. For example, although an ideal charge pump may generate an output voltage VOUT that is N times as high as an input voltage VIN, in a steady state, an actual charge pump may generate an output voltage VOUT, which is less than N times the input voltage VIN due to parasitic elements such as a parasitic capacitance and leakage elements such as a parasitic resistance of a capacitor. Accordingly, a designer may determine the number of stages N of the actual charge pump in consideration of the parasitic elements and the leakage elements. For example, the designer may determine the number of stages N of the charge pump in consideration of a headroom of about 25%. In Equation 1, the constant a, which is a value reflecting the parasitic elements and the leakage elements, may be a value (e.g., about 0.75), which is less than or equal to 1 to correspond to the ideal charge pump.

According to exemplary embodiments of the inventive concept, the capacitance Cadj of the adjustment capacitor C_ADJ may be determined based on the capacitances C of the capacitors (e.g., the capacitors C_1, C_2, ... C_N of FIG. 2) included in the respective stages of the actual charge pump. As described above, the capacitances C may be values derived from the original charge pump. This adjustment capacitor C_ADJ may be added to the pool/fly capacitor included at the output terminal of the original N-Stage charge pump, which may reside outside the N-Stage charge pump. This adjustable capacitor may account for the fine-tuning or adjustment of the rise or fall time of the voltage profile which is obtained from the charge pump macro model. The capacitance Cadj of the adjustment capacitor C_ADJ included in the passive device block 400a of the charge pump macro model 10a may be determined based on the capacitance C, which may be provided by a designer. For example, the capacitance Cadj of the adjustment capacitor C_ADJ may be determined by Equation 2:

$$\text{Cadj} = (N \times C)/3. \qquad \text{Equation 2:}$$

According to exemplary embodiments of the inventive concept, the capacitance Cadj of the adjustment capacitor C_ADJ may be adjusted based on result data generated by simulating the charge pump macro model 10a. For example, the capacitance Cadj of the adjustment capacitor C_ADJ may be adjusted based on first result data, which is result data obtained by simulating the original charge pump using the original charge pump as input data of the electronic circuit simulator, and second result data, which is result data obtained by simulating the charge pump macro model 10a under the same conditions as when the original charge pump is simulated to generate the first result data. For example, the capacitance Cadj of the adjustment capacitor C_ADJ may be adjusted such that a difference between the first result data and the second result data (e.g., the average of the difference in an exemplary embodiment) becomes less than a predetermined value.

As described above, a charge pump may be included in a specific application such as, for example, a smart power IC or a non-volatile memory device. The charge pump model 10a according to exemplary embodiments of the inventive concept may reduce the total simulation time during a process of simulating the entire circuit of the application (e.g., a full-chip simulation process).

In addition, according to exemplary embodiments of the inventive concept, the capacitance Cadj of the adjustment capacitor C_ADJ may be provided by a designer. For example, the capacitance Cadj of the adjustment capacitor C_ADJ may be affected by the configuration of an actual charge pump. The value of the adjustment capacitor C_ADJ may remain constant for each family or generation of products such as, for example, a smart power IC or a non-volatile memory device, and may be fine-tuned for a new generation of products or circuits. The electronic circuit simulator may set a value of the adjustment capacitor C_ADJ to the capacitance Cadj provided based on the configuration of the actual charge pump designed by the designer.

Figures 4, 5:
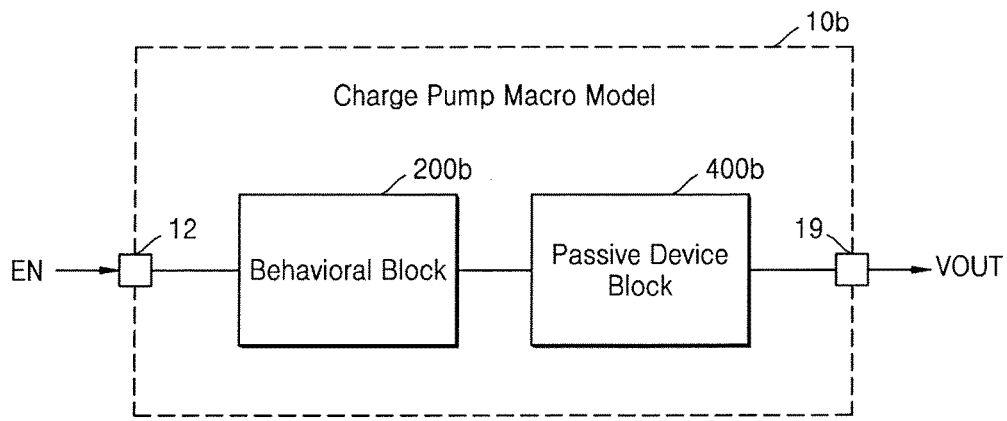
FIG. 4 illustrates an example of a voltage multiplier of FIG. 3, which is defined using a modeling language according to exemplary embodiments of the inventive concept.
FIG. 5 is a schematic diagram of a charge pump macro model generated to simulate an original charge pump according to exemplary embodiments of the inventive concept.

FIG. 4 illustrates an example of the voltage multiplier 220a of FIG. 3, which is defined using a modeling language according to exemplary embodiments of the inventive concept. The example shown in FIG. 4 is pseudo-code 401 by which the voltage multiplier 220a of FIG. 3 is exemplarily defined using Verilog-A. It will be understood that the voltage multiplier 220a according to exemplary embodiments of the inventive concept is not limited to the example shown in FIG. 4. For example, the voltage multiplier 220a of FIG. 3 may be defined using an alternative function provided by the modeling language, and may be defined using other modeling languages.

In the example shown in FIG. 4, the voltage multiplier 220a of FIG. 3 may be defined as a module 'vmult' (line 1), which may have an output port 'out' (line 3). The module 'vmult' may increase the source voltage VSRC, where 'eve' denotes the value of the source voltage VSRC, by N times (line 15), and may output a voltage, which is multiplied by N times, to the output port 'out' (line 17). In the present example, the source voltage VSRC may correspond to the input voltage of the original charge pump (e.g., a power supply voltage VDD), and the output port 'out' may correspond to a terminal of the voltage multiplier 220a.

FIG. 5 is a schematic diagram of a charge pump macro model generated to simulate an original charge pump according to exemplary embodiments of the inventive concept. As shown in FIG. 5, a charge pump macro model 10b according to exemplary embodiments of the inventive concept may include an enable terminal 12 and an output terminal 19, through which the charge pump macro model 10b may be connected to an external circuit. The charge pump macro model 10b may further include a behavioral block 200b and a passive device block 400b.

Similar to the behavioral block 200 of FIG. 1, the behavioral block 200b of FIG. 5 may be a block defined by a modeling language defining operations of an analog or mixed-signal system. The behavioral block 200b may receive a control signal (e.g., an enable signal EN) through the enable terminal 12, unlike the behavioral block 200 of FIG. 1. A relationship between signals input to the behavioral block 200b through the enable terminal 12 and a signal generated and output by the behavioral block 200b may be defined based on operations of the behavioral block 200b described using the modeling language. An electronic circuit simulator may determine states of signals, which may interface with the behavioral block 200b, based on the behavioral block 200b defined using the modeling language.

The passive device block 400b may include at least one passive device such as, for example, a resistor or a capacitor, and may be disposed between the behavioral block 200b and the output terminal 19 of the charge pump macro model 10b. The electronic circuit simulator may determine states of signals, which may interface with a passive device, based on proper characteristics of the passive device and values of the passive device.

Figure 6:
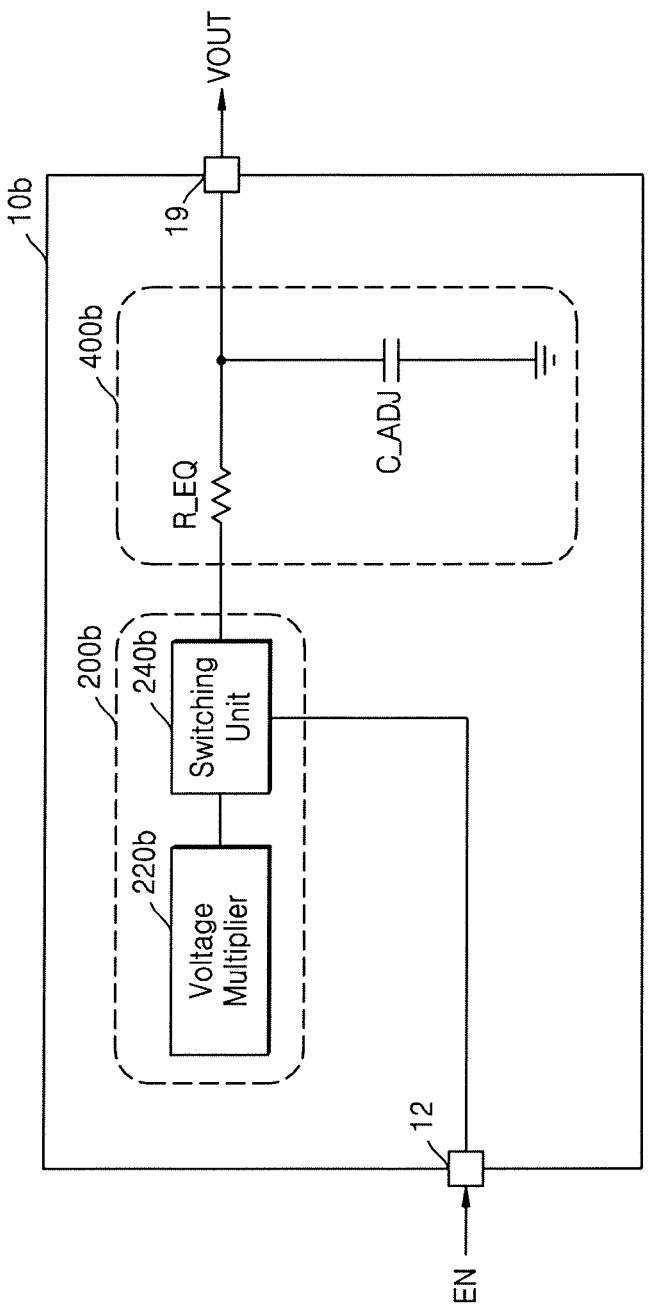
FIG. 6 is a block diagram of an example of the charge pump macro model of FIG. 5, according to exemplary embodiments of the inventive concept.

FIG. 6 is a block diagram of an example of the charge pump macro model of FIG. 5, according to exemplary embodiments of the inventive concept. As described with reference to FIG. 5, the charge pump macro model 10b may include the enable terminal 12, the output terminal 19, the behavioral block 200b, and the passive device block 400b. The enable signal EN may be applied from the outside of the charge pump macro model 10b to the enable terminal 12. The charge pump macro model 10b may generate an output voltage VOUT and provide the output voltage VOUT through the output terminal 19.

As shown in FIG. 6, the behavioral block 200b may include a voltage multiplier 220b and a switching unit 240b. The voltage multiplier 220b may internally generate N times the fixed source voltage VSRC and directly feed the final charge pump target voltage to the input terminal of the switching unit 240b. The switching unit 240b may be connected to the voltage multiplier 220b and the passive device block 400b. The voltage multiplier 220b may operate in a similar manner as the voltage multiplier 220a of the charge pump macro model 10a shown in FIG. 3. For example, the voltage multiplier 220b may generate a voltage that is N times as high as the source voltage VSRC defined in the voltage multiplier 220a, and may transmit the voltage to the switching unit 240b. According to exemplary embodiments of the inventive concept, the voltage multiplier 220b may be defined using a modeling language as shown in FIG. 4.

The switching unit 240b may be defined by a modeling language to connect the voltage multiplier 220b and the passive device block 400b, or to disconnect the voltage multiplier 220b from the passive device block 400b in response to an enable signal EN received through the enable terminal 12 of the charge pump macro model 10b. For example, when the enable signal EN is in a high state (e.g., about equal to a power supply voltage VDD in an exemplary embodiment), the switching unit 240b may transmit a voltage, which is generated by the voltage multiplier 220b, to the passive device block 400b. When the enable signal EN is in a low state (e.g., about equal to a ground voltage), the switching unit 240b may prevent a voltage, which is generated by the voltage multiplier 220b, from being transmitted to the passive device block 400b.

As shown in FIG. 6, the passive device block 400b may include an equivalent resistor R_EQ and an adjustment capacitor C_ADJ. The ends of the equivalent resistor R_EQ may be respectively connected to the switching unit 240b of the behavioral block 200b and the output terminal 19 of the charge pump macro model 10b. The ends of the adjustment capacitor C_ADJ may be connected to the output terminal 19 of the charge pump macro model 10b and ground. Similar to the exemplary embodiment shown in FIG. 3, values of the equivalent resistor R_EQ and the adjustment capacitor C_ADJ may be determined, and an electronic circuit simulator may simulate operations of the passive device block 400b based on a resistance Req of the equivalent resistor R_EQ and a capacitance Cadj of the adjustment capacitor C_ADJ.

Figure 12:
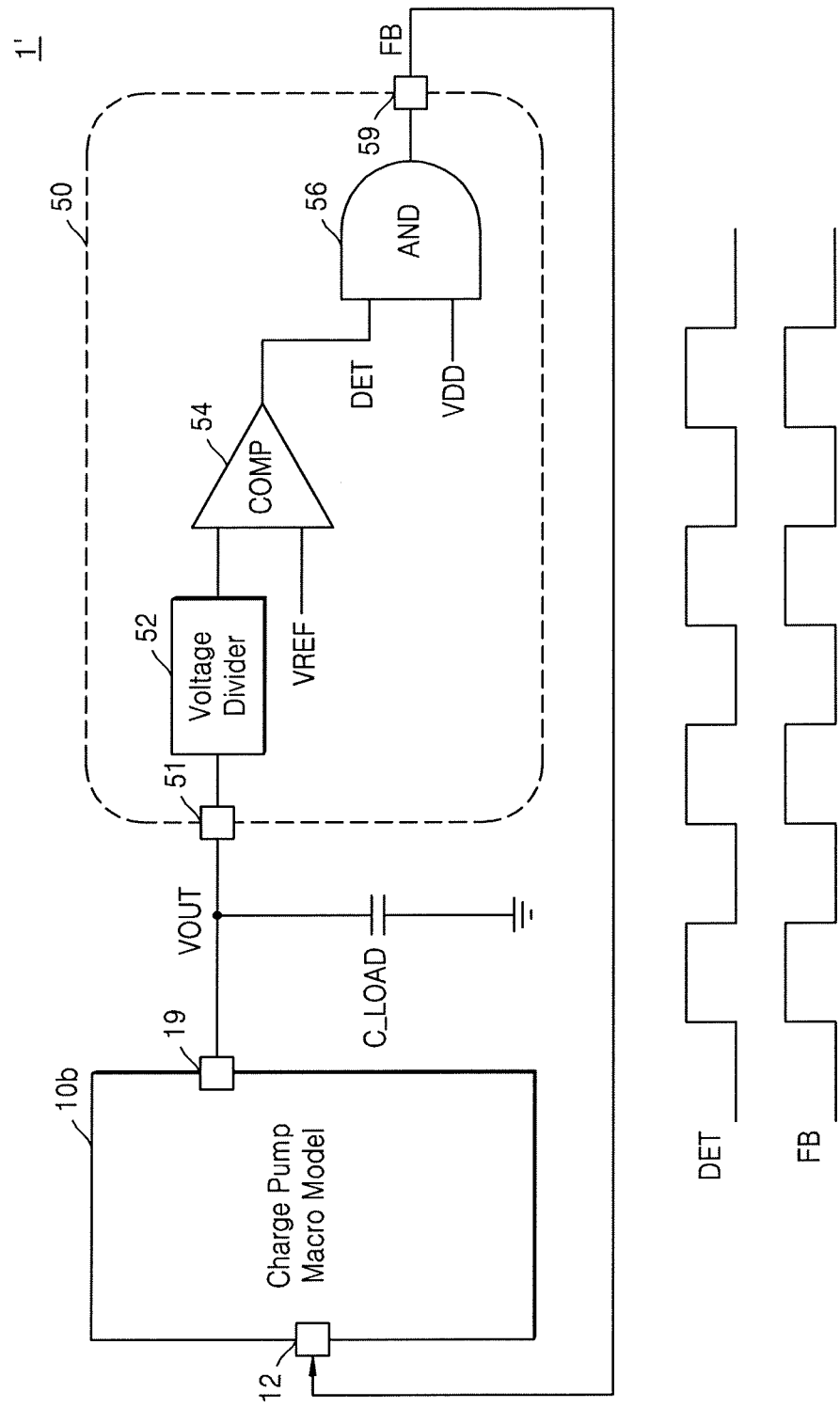
FIG. 12 is a schematic block diagram of a simulation model configured to simulate the electronic circuit of FIG. 11 according to exemplary embodiments of the inventive concept.

The enable signal EN may be a signal configured to control operations of the charge pump macro model 10b based on the state of the output voltage VOUT of the charge pump macro model 10b, and the charge pump macro model 10*b* may be combined with a regulator 50 to form a negative feedback loop (see FIG. 12). An application (e.g., a smart power IC or a non-volatile memory device) including an actual charge pump may include a negative feedback loop to maintain a voltage output by a charge pump within a desired range. In the exemplary embodiment shown in FIG. 6, the enable terminal 12 of the charge pump macro model 10*b* may provide an input port for a signal (e.g., enable signal EN) used for the negative feedback loop.

Figure 7:
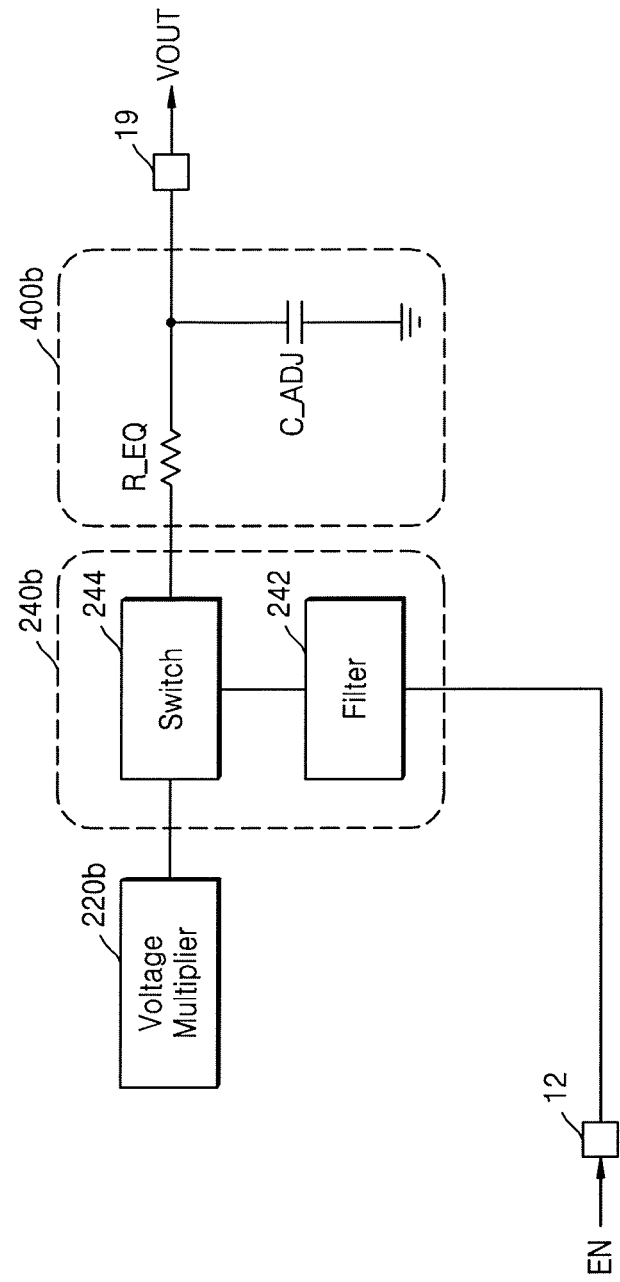
FIG. 7 is a block diagram of an example of a switching unit of FIG. 6, according to exemplary embodiments of the inventive concept.

FIG. 7 is a block diagram of an example of the switching unit 240*b* of FIG. 6, according to exemplary embodiments of the inventive concept. FIGS. 8 and 9 respectively illustrate exemplary Verilog-A pseudo-codes 801 and 901 of a filter 242 and a switch 244 that are included in the switching unit 240*b*. Referring to FIGS. 6 and 7, the switching unit 240*b* may be connected to the voltage multiplier 220*b* and the equivalent resistor R_EQ of the passive device block 400*b* and connected to the enable terminal 12. As shown in FIG. 7, the switching unit 240*b* may include a switch 244 and a filter 242. The filter 242 may be connected to the enable terminal 12 and the switch 244. The switch 244 may be connected to the voltage multiplier 220*b*, the equivalent resistor R_EQ of the passive device block 400*b*, and the filter 242.

The filter 242 may filter the enable signal EN received through the enable terminal 12, and may transmit a filtered signal to the switch 244. As described above, the enable signal EN may be a signal received from an external circuit of the charge pump macro model 10*b* such as, for example, the regulator 50 of FIG. 12. The enable signal EN may be an analog signal. The filter 242 may filter the enable signal EN such that the switch 244 may recognize a state of the enable signal EN.

Referring to the example shown in FIG. 8, the filter 242 of FIG. 7 may be defined as a module 'filter' (line 1), and the module 'filter' may have an input port 'in' and an output port 'out' (lines 3 and 4). The module 'filter' may apply a voltage of about 1.0 V to the output port 'out' when a voltage of the input port 'in' exceeds about 0.5 V (line 12), and may apply a voltage of about 0.0 V to the output port 'out' when the voltage of the input port 'in' is lower than about 0.5 V (line 14). As a result, two different voltages (e.g., about 1.0 V or about 0.0 V), may be applied to the output port 'out' of the module 'filter' according to the voltage of the input port 'in'. In the present example, the input port 'in' of the module 'filter' may correspond to a terminal of the filter 242 through which the enable signal EN is received, and the output port 'out' may correspond to a terminal of the filter 242 through which a signal obtained by filtering the enable signal EN is output.

In FIG. 7, the switch 244 may connect the voltage multiplier 220*b* and the equivalent resistor R_EQ or may disconnect the voltage multiplier 220*b* from the equivalent resistor R_EQ based on the filtered signal received from the filter 242. That is, a voltage output by the voltage multiplier 220*b* may be selectively transmitted to the equivalent resistor R_EQ.

Referring to the example shown in FIG. 9, the switch 244 of FIG. 7 may be defined as a module 'switch' (line 1), and the module 'switch' may have input ports 'a' and 'en' and an output port 'b' (lines 3 and 4). The module 'switch' may set a conductance between the input port 'a' and the output port 'b' to about 0.01 S(A/V) or about 0.0 S(A/V) (lines 8 and 9). The conductance may be a value corresponding to a reciprocal of a resistance. A case in which the conductance is about 0 may correspond to an 'open' state. The module 'switch' may set a conductance between the input port 'a' and the output port 'b' to about 0.01 S when a voltage of the input port 'en' is about 1.0 V (line 14), and set a conductance between the input port 'a' and the output port 'b' to about 0.0 S when the voltage of the input port 'en' is not about 1.0 V (e.g., when the voltage of the input port 'en' is about 0.0 V according to an example of the filter 242 shown in FIG. 8) (line 18). In the present example, the input port 'a' of the module 'switch' may correspond to a terminal of the switch 244 connected to the voltage multiplier 220*b* of FIG. 7, and the output port 'b' may correspond to a terminal of the switch 244 connected to the equivalent resistor R_EQ of FIG. 7.

Although the exemplary embodiment shown in FIG. 7 describes a case in which the switching unit 240*b* includes two separate blocks (e.g., the switch 244 and the filter 242), exemplary embodiments of the inventive concept are not limited thereto. According to exemplary embodiments of the inventive concept, it will be understood that the switching unit 240*b* may be defined using a modeling language such that the switching unit 240*b* alone may perform operations corresponding to the switch 244 and the filter 242. Further, although the examples shown in FIGS. 8 and 9 are pseudo-codes 801 and 901 in which the filter 242 and the switch 244 of FIG. 7 are respectively defined using Verilog-A, and it will be understood that the filter 242 and the switch 244 according to exemplary embodiments of the inventive concept are not limited to the examples shown in FIGS. 8 and 9. For example, the filter 242 and switch 244 of FIG. 7 may be defined using alternative functions provided by the modeling language, and may be defined using other modeling languages. For example, a function 'cross' may be used for the function 'above' of FIG. 8.

FIG. 10 illustrates an example of the charge pump macro model 10*b* of FIG. 6, which is defined using a modeling language according to exemplary embodiments of the inventive concept. In the example shown in FIG. 10, passive devices included in the passive device block 400*b* are included in the charge pump macro model 10*b* using a modeling language (lines 21 and 22). However, in the present example, the equivalent resistor R_EQ and the adjustment capacitor C_ADJ of the passive device block 400*b* merely have respective proper values and are connected to other components. That is, according to exemplary embodiments of the inventive concept, the passive device block 400*b* may be included in the charge pump macro model 10*b* in a different manner from the example shown in FIG. 10, for example, as discrete passive devices (e.g., passive devices included in a netlist) that combine with the behavioral block 200*b* defined as a single module using a modeling language. The example shown in FIG. 10 is pseudo-code 1001 by which the charge pump macro model 10*b* of FIG. 6 is exemplarily defined using Verilog-A. It will be understood that the charge pump macro model 10*b* according to exemplary embodiments of the inventive concept is not limited to the example shown in FIG. 10. For example, the charge pump macro model 10*b* may be defined using an alternative function provided by the modeling language, and may be defined using other modeling languages.

As shown in FIG. 10, in the present example, the charge pump macro model 10*b* of FIG. 6 may be defined as a module 'CP' (line 4), and the module 'CP' may have input ports 'en' and an output port 'vout' (lines 6 and 7). The number of stages N included in an actual charge pump corresponding to the charge pump macro model 10*b* may be, for example, 6, the equivalent resistor R_EQ included in the passive device block 400*b* may have, for example, a resistance Req of about 13.173 kΩ, and the adjustment capacitor C_ADJ included in the passive device block 400b may have, for example, a capacitance Cadj of about 90 pF. The module 'CP' may include the module 'vmult' defined in FIG. 4 (line 19), the module 'filter' defined in FIG. 8 (line 18), and the module 'switch' defined in FIG. 9 (line 20). In the present example, the input ports 'en' of the module 'CP' may correspond to the enable terminal 12 of FIG. 6, and the output port 'vout' may correspond to the output terminal 19. In an exemplary embodiment, the examples illustrated in FIGS. 4, 8, 9 and 10 may be incorporated in a single file. For example, the charge pump macro model 10b of FIG. 6 may be generated as a single file such as, for example, one Verilog-A file.

Figure 11:
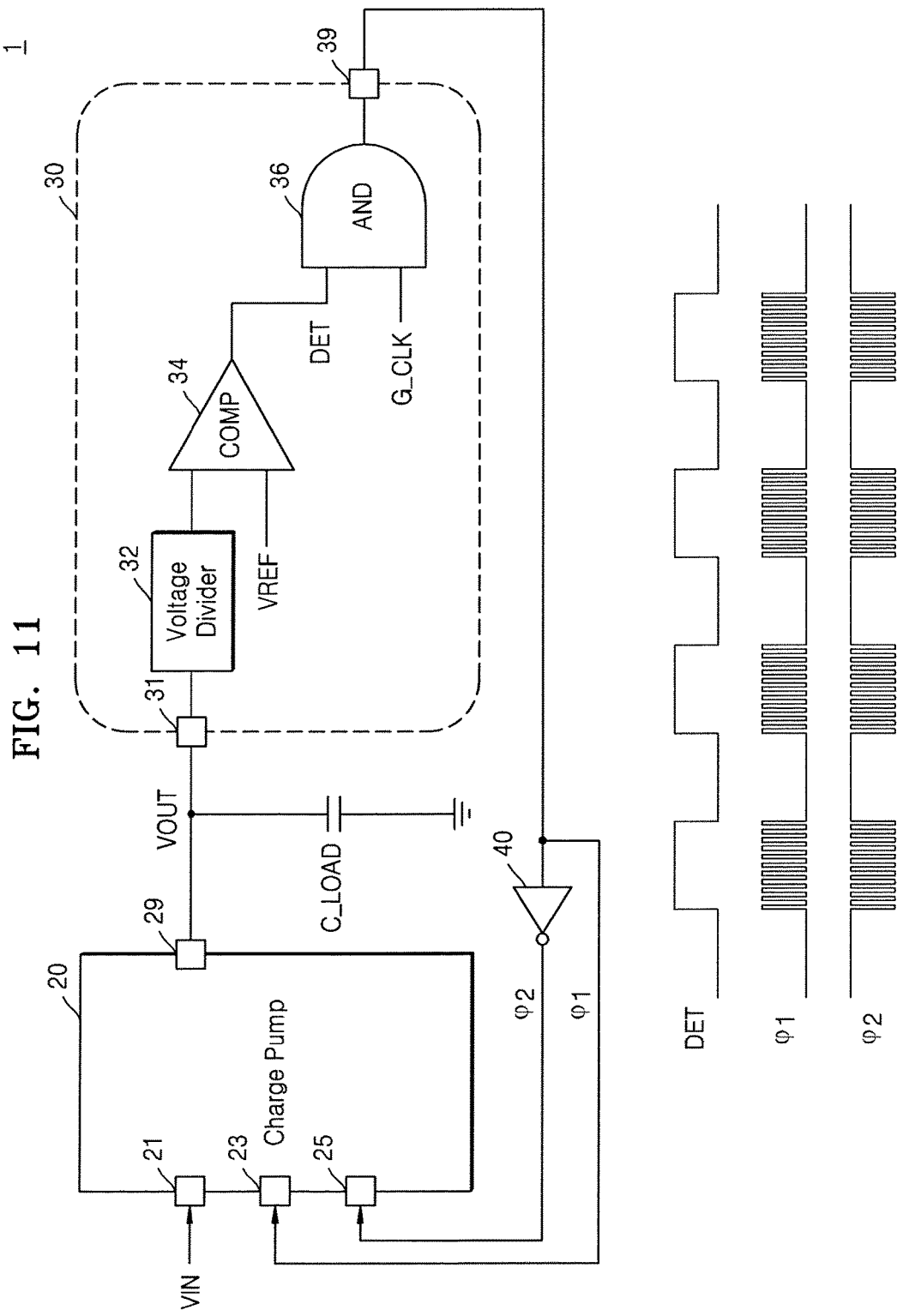
FIG. 11 is a schematic block diagram of an example of an electronic circuit including a charge pump according to exemplary embodiments of the inventive concept.

FIG. 11 is a schematic block diagram of an example of an electronic circuit 1 including a charge pump 20 according to exemplary embodiments of the inventive concept. As described above, an application (or electronic circuit 1) including the charge pump 20 may include a negative feedback loop that maintains a voltage output by the charge pump 20 within a desired range. As shown in FIG. 11, the electronic circuit 1 may include a charge pump 20, a regulator 30, an inverter 40, and a load capacitor C_LOAD. The regulator 30 may selectively generate a transition of a first clock signal φ1 based on an output voltage VOUT output by the charge pump 20 and a predetermined reference voltage, and control the charge pump 20. Thus, a negative feedback loop may be formed.

As shown in FIG. 11, the charge pump 20 may include an input terminal 21 to which an input voltage VIN is applied, a first clock terminal 23 to which a first clock signal φ1 is applied, a second clock terminal 25 to which a second clock signal φ2 is applied, and an output terminal 29 from which an output voltage VOUT is generated. The charge pump 20 shown in FIG. 11 may generate the output voltage VOUT, which is N times as high as the input voltage VIN, using the first clock signal φ1 and the second clock signal φ2 as shown in FIG. 2. The load capacitor C_LOAD may be connected to the output terminal 29 of the charge pump 20 and may accumulate or emit charges. The inverter 40 may invert the first clock signal φ1 and generate the second clock signal φ2.

As shown in FIG. 11, the regulator 30 may include an input terminal 31 to which the output voltage VOUT is received from the charge pump 20 and an output terminal 39 from which the first clock signal φ1 is sent. The regulator 30 may further include a voltage divider 32, a comparator 34, and an AND gate 36. The voltage divider 32 may divide the output voltage VOUT received through the input terminal 31 in a fixed ratio, and provide a divided voltage to the comparator 34. For example, the voltage divider 32 may include a plurality of resistors connected in series. The comparator 34 may receive a voltage obtained by dividing the output voltage VOUT and a reference voltage VREF, and generate a detection signal DET based on a result obtained by comparing the voltages. Utilizing the voltage divider 32 and the comparator 34, the regulator 30 may generate a detection signal DET, which may indicate whether the output voltage VOUT is higher or lower than a predetermined target voltage (e.g., a voltage obtained by multiplying VOUT by a voltage division ratio of the voltage divider 32 and comparing it to a fixed reference voltage VREF). For example, the detection signal DET may be in a high state (e.g., about equal to a power supply voltage VDD) when the output voltage VOUT is lower than a target voltage, and be in a low state (e.g., about equal to a ground voltage) when the output voltage VOUT is higher than the target voltage.

The AND gate 36 may perform an 'AND' function on the detection signal DET generated by the comparator 34 and a global clock signal G_CLK, and generate the first clock signal φ1. The global clock signal G_CLK may be a signal that continuously oscillates at a frequency 'f'. Thus, as shown in a lower portion of FIG. 11, the first clock signal φ1 and the second clock signal φ2 may oscillate in response to the global clock signal G_CLK while the detection signal DET is in a high state. Referring to FIG. 2, since charges of the charge pump 20 are moved from a node of the input voltage VIN to a node of the output voltage VOUT due to transitions of the first clock signal φ1 and the second clock signal φ2, the load capacitor C_LOAD may emit charges during a period in which the first clock signal φ1 and the second clock signal φ2 do not oscillate (e.g., during a period in which the detection signal DET is in a low state). Thus, the output voltage VOUT may be dropped. As a result, the charge pump 20 may be controlled by negative feedback, and the output voltage VOUT may be maintained within a predetermined range.

FIG. 12 is a schematic block diagram of a simulation model 1' configured to simulate the electronic circuit 1 of FIG. 11 according to exemplary embodiments of the inventive concept. The simulation model 1' may include a charge pump macro model 10b, a regulator 50, and a load capacitor C_LOAD. The charge pump macro model 10b may be similar to the charge pump macro model 10b of FIG. 5, and may include an enable terminal 12 and an output terminal 19. Similar to the regulator 30 included in the electronic circuit 1 of FIG. 11, the regulator 50 may include an input terminal 51 and an output terminal 59, as well as a voltage divider 52, a comparator 54, and an AND gate 56.

According to exemplary embodiments of the inventive concept, the regulator 50 of the simulation model 1' may generate a feedback signal FB that controls the charge pump macro model 10b. Compared to the regulator 30 included in the electronic circuit 1 shown in FIG. 11, the AND gate 56 included in the regulator 50 of the simulation model 1' may receive a power supply voltage VDD instead of a global clock signal G_CLK. That is, as shown in the lower portion of FIG. 12, the AND gate 56 may generate a feedback signal FB, which may depend on the detection signal DET output by the comparator 54, and the feedback signal FB may be generated from the regulator 50 through the output terminal 59 of the regulator 50. The feedback signal FB generated by the regulator 50 may be applied to the enable terminal 12 of the charge pump macro model 10b.

When the electronic circuit 1 shown in FIG. 11 is compared with the simulation model 1' shown in FIG. 12, the first clock signal φ1 and the second clock signal φ2, which may oscillate in the electronic circuit 1 at the same frequency 'f' as the global clock signal G_CLK, may not appear in the simulation model 1'. Instead, in the simulation model 1' according to an exemplary embodiment, the charge pump macro model 10b may be controlled in response to the feedback signal FB synchronized with the detection signal DET due to the charge pump macro model 10b and the regulator 50 of which an internal signal is changed.

As shown in FIG. 12, the feedback signal FB may not oscillate at a high frequency 'f' like the first clock signal φ1 and the second clock signal φ2. The feedback signal FB may be a strobe signal, which may not oscillate at a constant frequency. As described above, as changes (e.g., transitions) of signals frequently occur, the time taken for the electronic circuit simulator to perform simulations may increase due to an increase in the amount of operations for the simulations. Thus, the simulation model 1' according to exemplary embodiments of the inventive concept may contribute to a reduction in the simulation time of the electronic circuit simulator. In addition, the number of events occurring inside the regulator 50 may be reduced by replacing the high-frequency global clock signal CLK with the fixed level power supply voltage VDD. This may lead to a lesser number of events inside the regulator 50, which in turn may directly affect the total simulation time.

Figure 13:
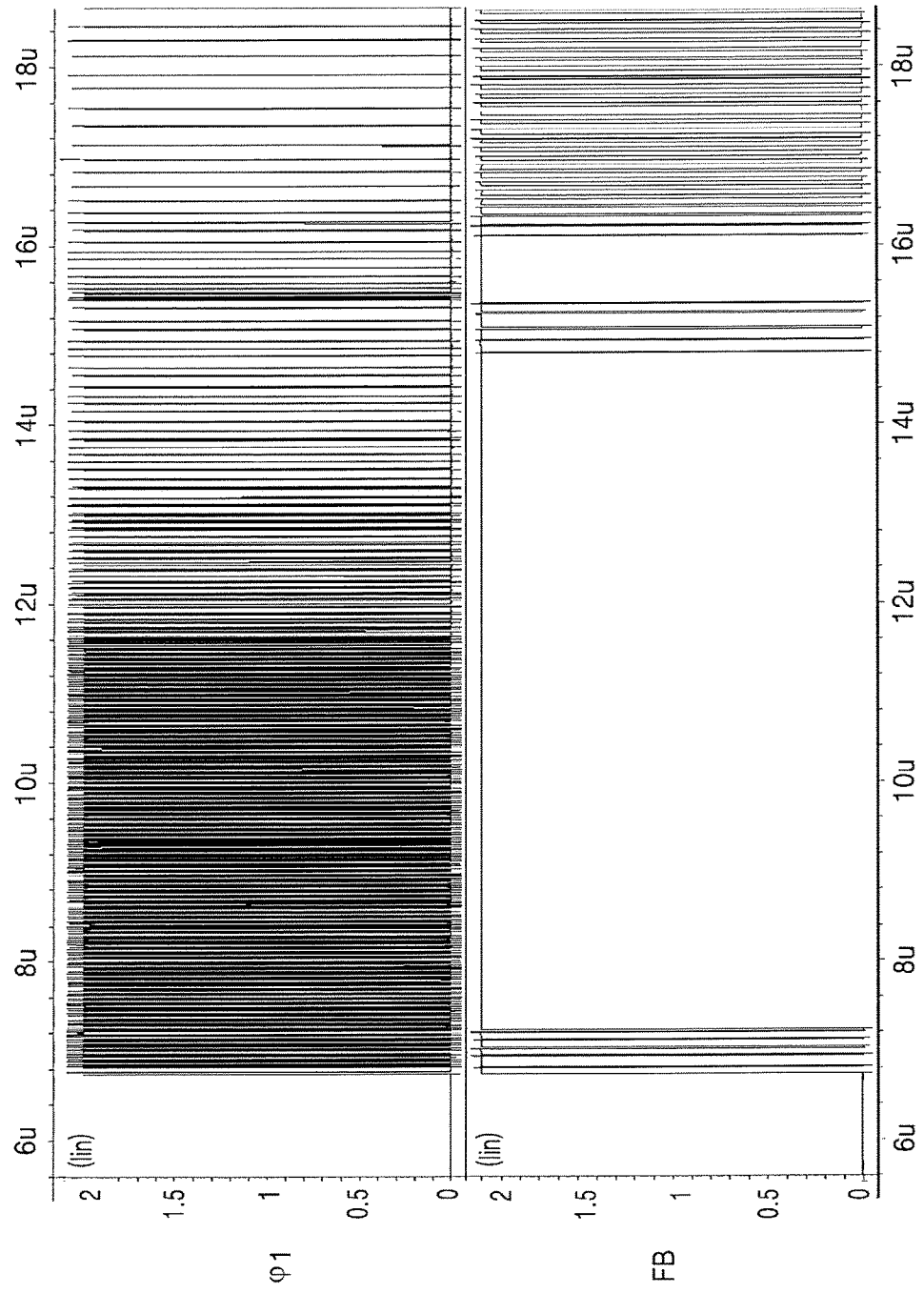
FIG. 13 shows graphs of simulation result data of a first clock signal of FIG. 11 and a feedback signal of FIG. 12, according to exemplary embodiments of the inventive concept.

FIG. 13 shows graphs of simulation result data of the first clock signal $\varphi 1$ of FIG. 11 and the feedback signal FB of FIG. 12, according to exemplary embodiments of the inventive concept. The upper portion of FIG. 13 corresponds to the first clock signal $\varphi 1$, and the lower portion of FIG. 13 corresponds to the feedback signal FB.

The graphs of FIG. 13 respectively illustrate result data generated by simulating the electronic circuit 1 of FIG. 11 and the simulation model 1' of FIG. 12 in the same operating environment, for example, through the use of the same test bench.

FIG. 13 illustrates that the number of transitions of the first clock signal yl is far larger than the number of transitions of the feedback signal FB. That is, the first clock signal $\varphi 1$ may make transitions between a high state and a low state more frequently than the feedback signal FB. For example, during an initial period of operation, the feedback signal FB is maintained in a high state, while the first clock signal $\varphi 1$ oscillates continuously. From the graphs shown in FIG. 13, it may be expected that the time taken for the electronic circuit simulator to simulate the simulation model 1' of FIG. 12 according to exemplary embodiments of the inventive concept will be reduced.

Figure 14:
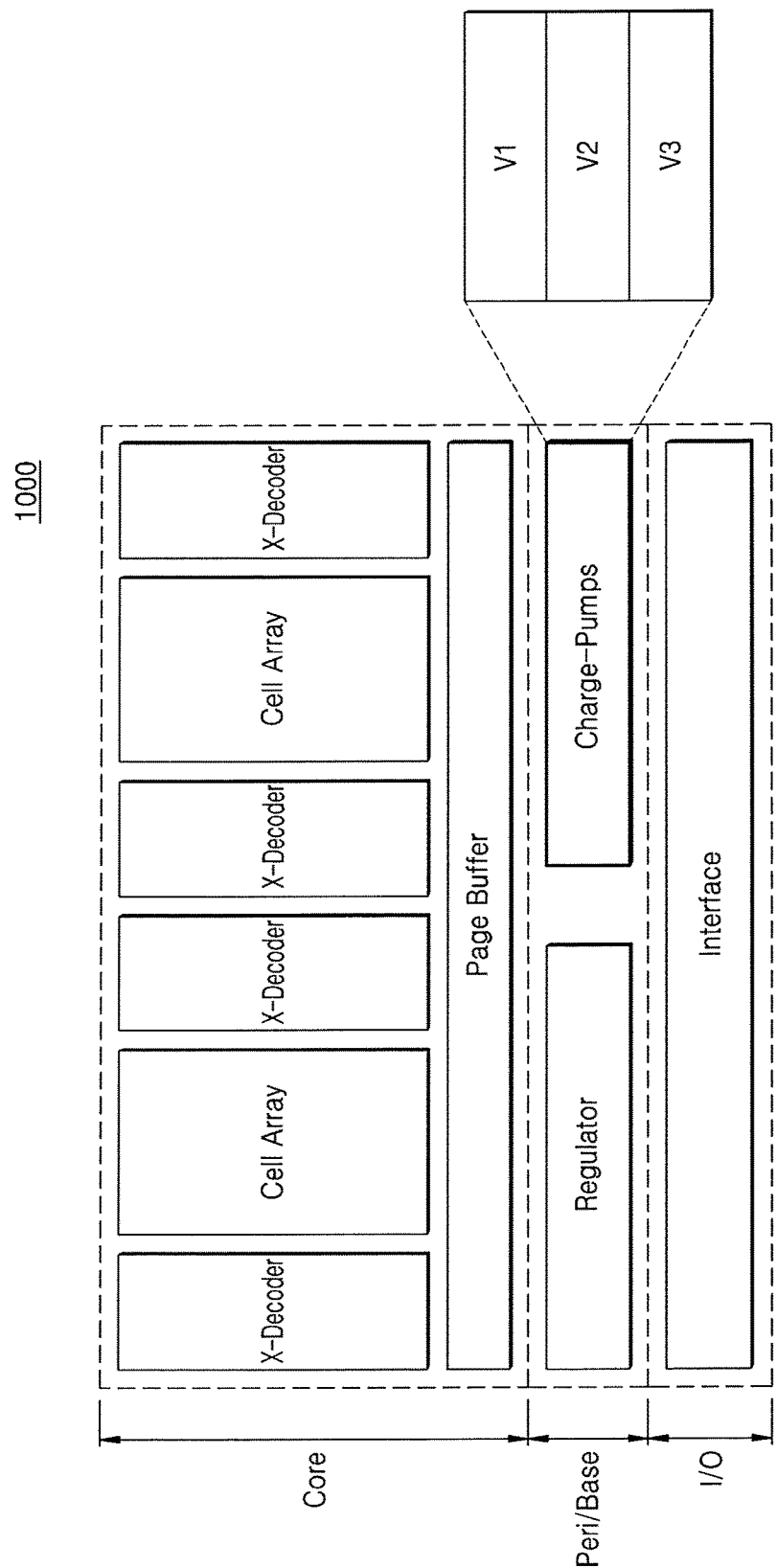
FIG. 14 is a schematic block diagram of a non-volatile memory device including a charge pump according to exemplary embodiments of the inventive concept.

FIG. 14 is a schematic block diagram of a non-volatile memory device 1000 including a charge pump according to exemplary embodiments of the inventive concept. As shown in FIG. 14, the non-volatile memory device 1000 may be divided into a core portion, a peripheral/base portion and an input/output (I/O) portion. The core portion may include, for example, a cell array(s) including a plurality of memory cells configured to store data, an X-decoder(s) configured to access the memory cells included in the cell array, and a page buffer configured to temporarily store data. The peripheral/base portion may include, for example, a plurality of charge pumps configured to generate a higher voltage than the power supply voltage VDD, and a regulator configured to control the charge pumps. The I/O portion may include, for example, an interface including a latch for data transmitted to or received from the outside of the non-volatile memory device 1000.

The non-volatile memory device 1000 may be, for example, a flash memory device. The flash memory device may use a higher voltage than a power supply voltage of the non-volatile memory device 1000 when data is written in memory cells or data stored in the memory cells is read or erased. Thus, the flash memory device may include a plurality of charge pumps, each of which may independently generate a voltage required by the flash memory device. For example, as shown in FIG. 14, the charge pumps included in the non-volatile memory device 1000 may generate three voltages—V1, V2, and V3. The voltage V1 may be used to read data stored in the memory cells. The voltage V2, which may be about 5.5 V, may be a DC voltage used for a specific block included in the non-volatile memory device 1000. The voltage V3 may be used to write data in the memory cells or erase data stored in the memory cells. The three voltages V1, V2, and V3 may have respectively different magnitudes. Thus, charge pumps configured to generate the respective voltages may have respectively different configurations. For example, the charge pumps may have the same input voltage (e.g., a power supply voltage supplied to the non-volatile memory device 1000), but may have different numbers of stages.

During the design phase of the non-volatile memory device 1000, respective blocks included in the non-volatile memory device 1000 may be discretely designed. Each of the blocks may be verified by a simulation process using an electronic circuit simulator, and a final design of each of the blocks may be derived. After the design of the discrete blocks is completed, a designer may combine at least two blocks and perform a simulation process for verifying the blocks, and the design of the respective blocks may be modified based on the simulation results. The designer may then combine all of the blocks of the non-volatile memory device 1000 using the electronic circuit simulator and perform a simulation (e.g., full-chip simulation).

As described above, the configurations of the charge pump macro model and the regulator according to exemplary embodiments of the inventive concept allow for the time taken to simulate an electronic circuit including charge pumps, including the time taken to perform a full-chip simulation, to be reduced.

FIG. 15 illustrates a simulation time that is reduced by performing a full-chip simulation using a charge pump model as a charge pump macro model according to exemplary embodiments of the inventive concept. As shown in FIG. 15, in an example, 24.55 hours were taken when a full-chip simulation was performed using an original charge pump for a read operation, while 10.13 hours were taken when a full-chip simulation was performed using a charge pump model for a read operation. Similarly, the time required was reduced at program and erase operations when a full-chip simulation was performed using a charge pump model. From the results shown in FIG. 15, it is illustrated that the time taken to perform a full-chip simulation using a charge pump model was about half the time taken to perform a full-chip simulation using an original charge pump.

Figure 16:
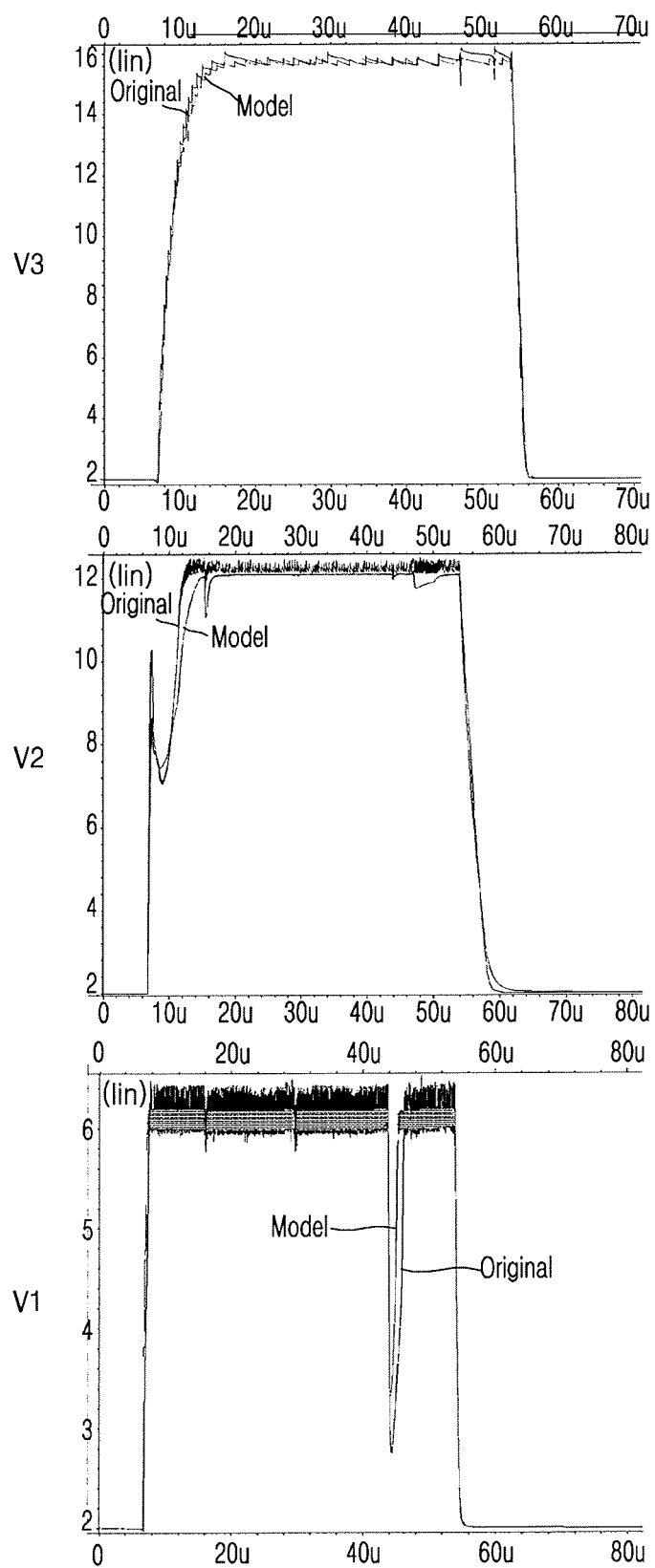
FIGS. 16, 17, and 18 are graphs showing result data obtained by simulating a charge pump model according to exemplary embodiments of the inventive concept during read, program, and erase operations.
Figure 17:
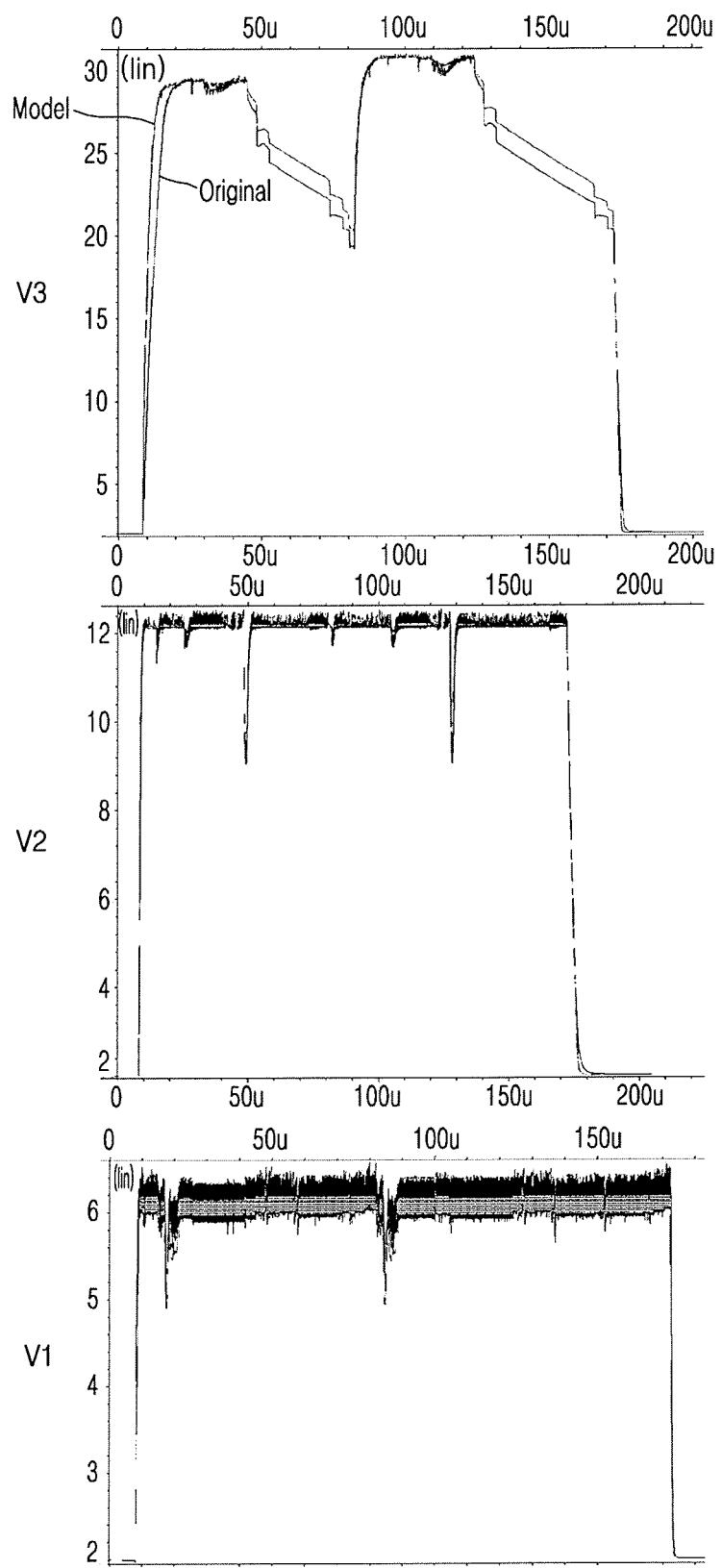
Figure 18:
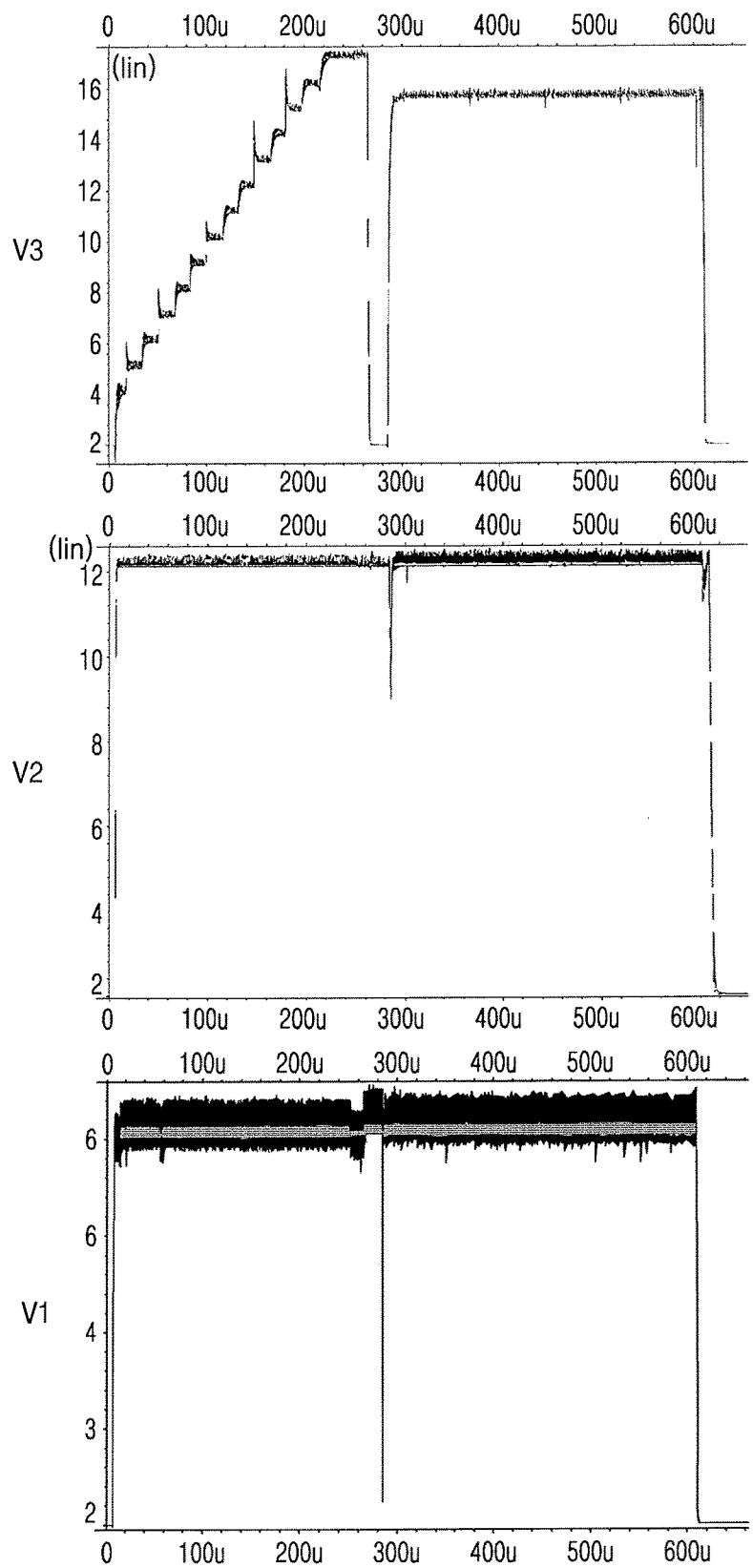

FIGS. 16, 17, and 18 are graphs showing result data obtained by simulating a charge pump model according to exemplary embodiments of the inventive concept during read, program, and erase operations. In FIGS. 16, 17, and 18, result data obtained by simulating an original charge pump in the same test bench is also illustrated. In a portion in which the result data overlaps, the result data obtained by simulating the original charge pump is illustrated in bold compared to the result data obtained by simulating the charge pump model according to the exemplary embodiments of the inventive concept. Further, in each of FIGS. 16, 17, and 18, the top-most waveform corresponds to a voltage V3, the middle waveform corresponds to a voltage V1, and the bottom-most waveform corresponds to a voltage V2.

As shown in FIGS. 16, 17, and 18, an output voltage of the charge pump model may have a ripple with a smaller magnitude than the output voltage of the original charge pump. This is a result of the charge pump model being controlled in response to a strobe signal instead of a clock signal. As a result of conducting extensive experiments, it can be seen that the output voltage of the charge pump model according to exemplary embodiments of the inventive concept may have a precision of about 90% or higher with respect to the output voltage of the original charge pump during the entire time period. Thus, when the charge pump model according to exemplary embodiments of the inventive concept is simulated, a precision of about 90% or higher may be maintained, and a simulation time may be reduced by at least half compared to a case in which the original charge pump is simulated. Further, the disk space used to save generated waveforms using the charge pump model in full-chip simulations may be about half of that consumed when the original charge pumps are used for the same simulation.

Figure 19:
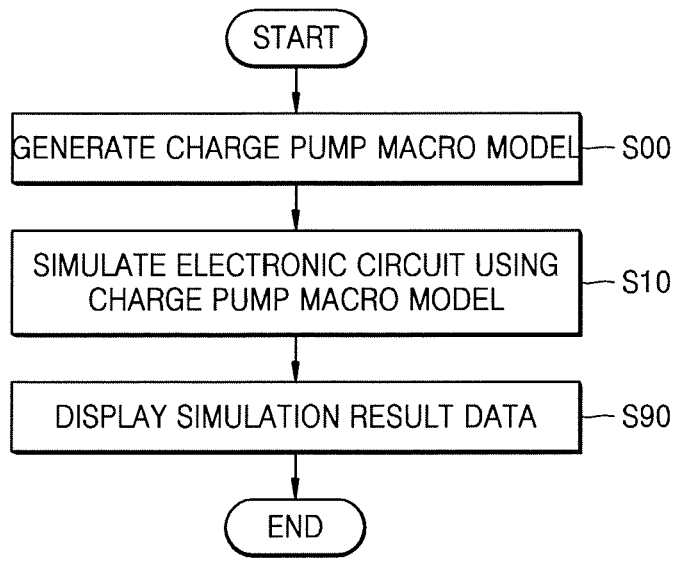
FIG. 19 is a flowchart illustrating a method of simulating an electronic circuit including a charge pump according to exemplary embodiments of the inventive concept.

FIG. 19 is a flowchart illustrating a method of simulating an electronic circuit including a charge pump according to exemplary embodiments of the inventive concept. The simulation method shown in FIG. 19 may be performed by, for example, an electronic circuit simulator embodied by software that may be utilized in a system including a processor. The electronic circuit simulator may generate a charge pump macro model corresponding to an original charge pump (S00). The charge pump macro model generated by the electronic circuit simulator may be a charge pump macro model according to one of the above-described exemplary embodiments of the inventive concept. The electronic circuit simulator may simulate a charge pump macro model or an electronic circuit including the electronic pump model using the generated charge pump macro model (S10). For example, the electronic circuit simulator may simulate an electronic circuit in which a charge pump macro model is coupled with a regulator, or may simulate an application (e.g., a non-volatile memory device) including a charge pump macro model. The electronic circuit simulator may display simulation result data to a user (S90). For example, as shown in FIGS. 16 through 18, the electronic circuit simulator may graphically provide simulation result data to a user.

Figure 20A:
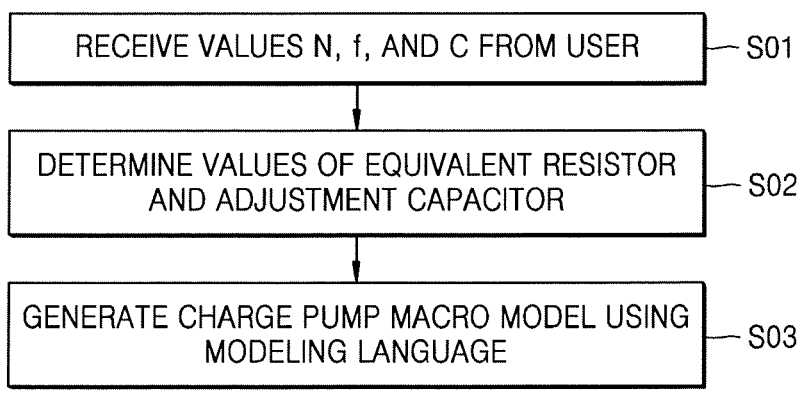
FIGS. 20A and 20B are flowcharts illustrating an operation of generating the charge pump macro model of FIG. 19 according to exemplary embodiments of the inventive concept.
Figure 20B:
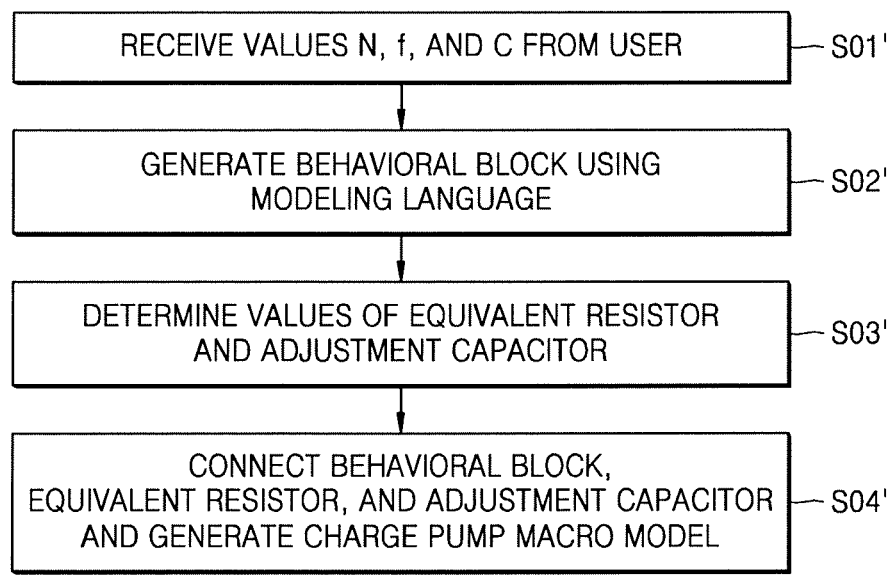

FIGS. 20A and 20B are flowcharts illustrating operation S00 of generating the charge pump macro model of FIG. 19, according to exemplary embodiments of the inventive concept. Referring to FIGS. 6 and 20A according to exemplary embodiments of the inventive concept, the passive device block 400b may be included in the charge pump macro model 10b in various manners. FIG. 20A illustrates an example in which the passive device block 400b is defined by a modeling language as in the example shown in FIG. 10. To generate the charge pump macro model, the electronic circuit simulator may receive the N number of stages included in the charge pump, the frequencies 'f' of the first and second clock signals φ1 and φ2, and a capacitance C of a capacitor included in each stage of the charge pump (S01).

Referring to FIGS. 6 and 20A, the electronic circuit simulator may determine values of the equivalent resistor R_EQ and the adjustment capacitor C_ADJ included in the passive device block 400b based on the values N, f, and C received from the user (S02). For example, the electronic circuit simulator may determine a resistance Req of the equivalent resistor R_EQ based on Equation 1, and may determine a capacitance Cadj of the adjustment capacitor C_ADJ based on Equation 2. The electronic circuit simulator may then generate the charge pump macro model using a modeling language (S03). For example, the electronic circuit simulator may define components included in the behavioral block 200b as in the examples shown in FIGS. 4, 8, and 9, and define the connection of respective components with passive devices as in the example shown in FIG. 10.

FIG. 20B illustrates an exemplary embodiment in which the passive device block 400b is defined in addition to the behavioral block 200b. Similar to the exemplary embodiment shown in FIG. 20A, the electronic circuit simulator may receive the values N, f, and C from a user (S01'). Referring to FIGS. 6 and 20B, the electronic circuit simulator may generate the behavioral block 200b using a modeling language (S02'). For example, the electronic circuit simulator may generate the voltage multiplier 220b or the switching unit 240b of FIG. 7 based on the value N received from the user. The electronic circuit simulator may determine values of the equivalent resistor R_EQ and the adjustment capacitor C_ADJ included in the passive device block 400b based on the values N, f, and C received from the user (S03'). The electronic circuit simulator may then connect the behavioral block 200b, the equivalent resistor R_EQ, and the adjustment capacitor C_ADJ, and generate the charge pump macro model (S04'). For example, the electronic circuit simulator may generate a netlist of an electronic circuit including the behavioral block 200b, the equivalent resistor R_EQ, and the adjustment capacitor C_ADJ.

Figure 21:
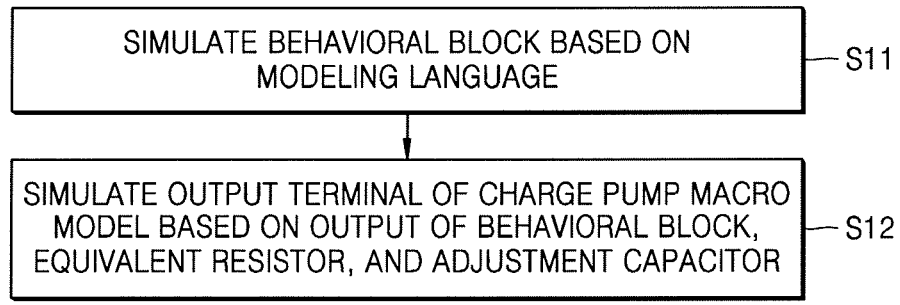
FIG. 21 is a flowchart illustrating an operation of simulating an electronic circuit using the charge pump macro model of FIG. 19 according to exemplary embodiments of the inventive concept.

FIG. 21 is a flowchart illustrating the operation S10 of simulating an electronic circuit using the charge pump macro model of FIG. 19 according to exemplary embodiments of the inventive concept. Referring to FIGS. 6 and 21, an electronic circuit simulator may simulate the behavioral block 200b based on a modeling language (S11). For example, the electronic circuit simulator may compile a modeling language by which the behavioral block 200b is defined. The electronic circuit simulator may simulate the output terminal 19 of the charge pump macro model 10b based on the output of the behavioral block 200b, the equivalent resistor REQ, and the adjustment capacitor C_ADJ (S12). When the output terminal 19 is connected to an arbitrary device (e.g., the load capacitor C_LOAD or the input terminal 51 of the regulator 50 in FIG. 12) outside the charge pump macro model 10b, the electronic circuit simulator may simulate the output terminal 19 (or a node connected to the output terminal 19) of the charge pump macro model 10b based on characteristics of the connected arbitrary device.

Figure 22:
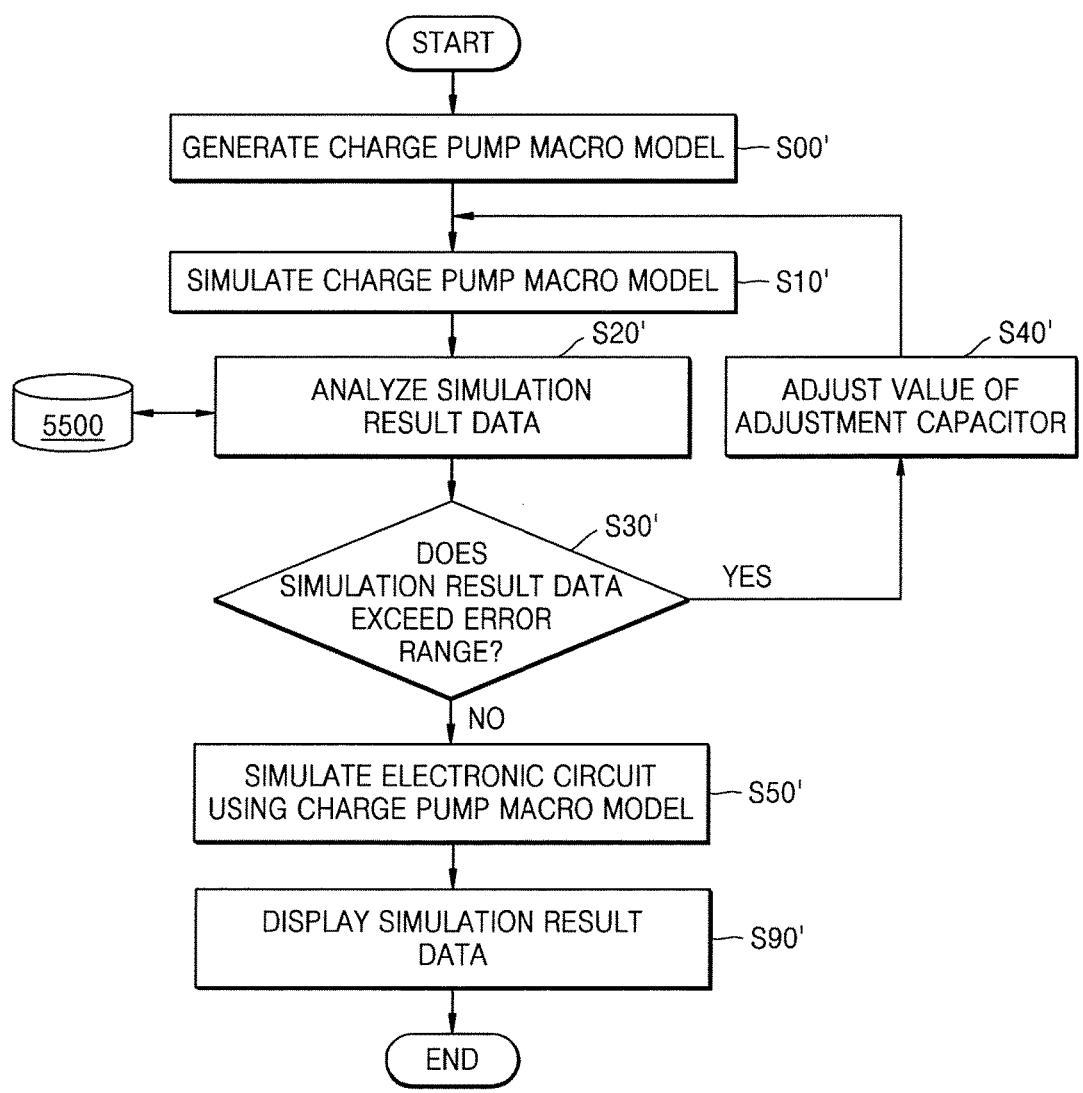
FIG. 22 is a flowchart illustrating a method of simulating an electronic circuit including a charge pump according to exemplary embodiments of the inventive concept.

FIG. 22 is a flowchart illustrating a method of simulating an electronic circuit including a charge pump according to exemplary embodiments of the inventive concept. Referring to FIGS. 6 and 22, an electronic circuit simulator may adjust the capacitance Cadj of the adjustment capacitor C_ADJ based on result data obtained by simulating the charge pump macro model 10b. Thus, the charge pump macro model 10b may include the adjustment capacitor C_ADJ having the adjusted capacitance Cadj, and the rise/fall time precision of result data obtained by simulating the charge pump macro model 10b may be improved.

For example, as shown in FIG. 22, the electronic circuit simulator may generate the charge pump macro model 10b (S00'). The electronic circuit simulator may simulate the generated charge pump macro model 10b (S10'). The electronic circuit simulator may analyze simulation result data (S20'). The electronic circuit simulator may access a data storage 5500 configured to store result data obtained by simulating an original charge pump, and compare the result data obtained by simulating the original charge pump with result data obtained by simulating the charge pump macro model 10b. The electronic circuit simulator may determine whether the result data obtained by simulating the charge pump macro model 10b exceeds a predetermined error range (S30'). When the result data obtained by simulating the charge pump macro model 10b exceeds the predetermined error range, the electronic circuit simulator may adjust a value of the adjustment capacitor C_ADJ (e.g., the capacitance Cadj) (S40').

The electronic circuit simulator may re-simulate the charge pump macro model 10b in which the adjustment capacitor C_ADJ has the adjusted capacitance Cadj (S10'). When the result data obtained by simulating the charge pump macro model 10b does not exceed an error range, the electronic circuit simulator may simulate an electronic circuit including the charge pump macro model 10b (S50'). The electronic circuit simulator may then display simulation result data to a user (S90').

Figure 23:
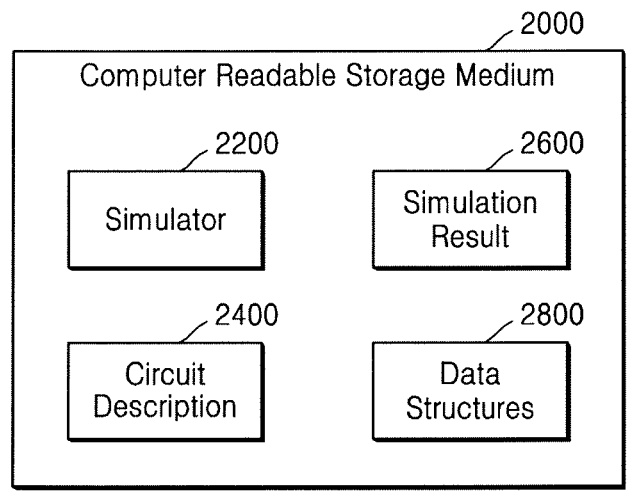
FIG. 23 is a block diagram of a computer-readable storage medium according to exemplary embodiments of the inventive concept.

FIG. 23 is a block diagram of a computer-readable storage medium 2000 according to exemplary embodiments of the inventive concept. The computer-readable storage medium 2000 may include an arbitrary storage medium, which may be read by a computer while being used to provide commands (e.g., via program instructions executable by a processor) and/or data to a computer. For example, according to exemplary embodiments of the inventive concept, a computer program product for a method of simulating an electronic circuit including an N-stage charge pump may include a non-transitory computer-readable storage medium having program instructions embodied therewith, which are executable by a processor to cause the processor to perform the simulation operations described herein. The computer-readable storage medium 2000 may include, for example, magnetic or optical media (e.g., discs, tapes, CD-ROMs, DVD-ROMs, CD-Rs, CD-RWs, DVD-Rs, DVD-RWs, etc.), volatile or non-volatile memories (e.g., RAMs, ROMs, flash memories, etc.), and micro-electromechanical systems (MEMS). The computer-readable storage medium 2000 may be inserted into a computer, integrated in a computer, or combined with a computer through a network and/or a communication medium, such as, for example, a wireless link.

As shown in FIG. 23, a computer-readable storage medium 2000 may include a simulator 2200, simulation result data 2600, a circuit description 2400 of an electronic circuit including a charge pump, and data structures 2800. The data structures 2800 may include data structures used during a simulation process. The simulator 2200, which is an electronic circuit simulator, may include commands for performing the above-described simulation method. For example, the computer-readable storage medium 2000 may store arbitrary commands for embodying some or all of the flowcharts shown in at least one of FIGS. 19 through 22.

Figure 24:
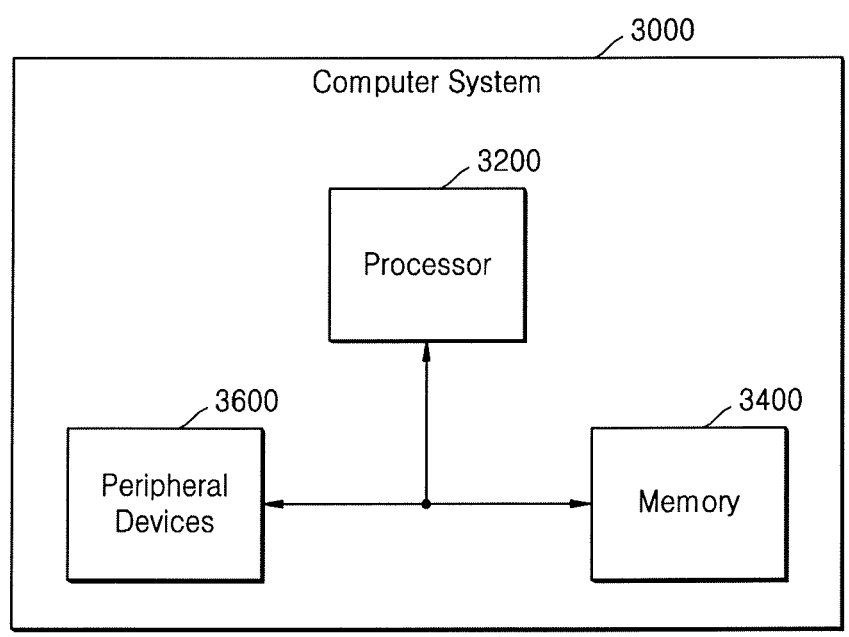
FIG. 24 is a block diagram of a computer system according to exemplary embodiments of the inventive concept.

FIG. 24 is a block diagram of a computer system 3000 according to exemplary embodiments of the inventive concept. As shown in FIG. 24, the computer system 3000 may include a processor 3200, a memory 3400, and various peripheral devices 3600. The processor 3200 may be connected to the memory 3400 and the peripheral devices 3600.

The processor 3200 may be configured to execute commands for performing the above-described method. According to exemplary embodiments of the inventive concept, the processor 3200 may execute arbitrary command sets (e.g., Intel Architecture-32 (IA-32), 64-bit extension IA-32, x86-64, PowerPC, Sparc, MIPS, ARM, IA-64, etc.). The computer system 3000 may further include additional processors.

The processor 3200 may be connected to the memory 3400 and the peripheral devices 3600 in a variety of manners. For example, the processor 3200 may be connected to the memory 3400 and/or the peripheral devices 3600 via various interconnects. In addition, one or more bridge chips may be used to couple the processor 3200, the memory 3400, and the peripheral devices 3600, creating multiple connections between these components.

The memory 3400 may include a variety of memory systems. For example, the memory 3400 may include a dynamic random access memory (DRAM), a double data rate synchronous DRAM (DDR SDRAM), or a Rambus DRAM (RDRAM). A memory controller may be included to interface with the memory 3400, and/or the processor 3200 may include the memory controller. The memory 3400 may store commands for performing the above-described simulation method and data processed by the processor 3200.

The peripheral devices 3600 may include an input device for receiving data from user and an output device for presenting simulation result data to the user. The peripheral devices 3600 may also include various hardware devices, which may be included in or combined with the computer system 3000, such as, for example, storage devices, or input/output (I/O) devices, such as, for example, video hardware, audio hardware, user interface devices, and networking hardware.

According to exemplary embodiments of the inventive concept, a non-transitory computer-readable storage medium may be configured to store a plurality of commands for executing a method of simulating an electronic circuit comprising an N-stage charge pump as described above. The non-transitory computer-readable storage medium may be included in a computer system (e.g., the computer system 3000).

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A method of simulating an electronic circuit comprising an N-stage charge pump, the method comprising:
generating a charge pump macro model corresponding to the N-stage charge pump, wherein N is an integer greater than or equal to 1, wherein generating the charge pump macro model comprises determining a resistance of the equivalent resistor based on a frequency of the clock signal input to the N-stage charge pump and a capacitance of a capacitor included in a single stage of the N-stage charge pump, wherein the resistance of the equivalent resistor is equal to $(a \times N)/(2f \times C)$, wherein a is a constant that is larger than 0 and equal to or less than 1, f is the frequency of the clock signal, and C is the capacitance of the capacitor included in the single stage of the N-stage charge pump; and
simulating the charge pump macro model, wherein the charge pump macro model comprises:
an enable terminal; an output terminal;
a behavioral block defined by a modeling language; and
a passive device block comprising at least one passive device connected to the output terminal and the behavioral block, wherein the passive device block comprises an equivalent resistor having one end connected to the output terminal and another end to which an output of the behavioral block is applied; and an adjustment capacitor connected between the output terminal and a ground voltage,
wherein a feedback signal is input to the enable terminal of the charge pump macro model in a simulation model simulating the electronic circuit, and a clock signal is input to the N-stage charge pump in electronic circuit; and
controlling the charge pump macro model in response to the feedback signal in the simulation model, wherein the N-stage charge pump is controlled in response to the clock signal in the non-simulated operation of the electronic circuit, wherein a number of transitions of the feedback signal between a high state and a low state in the simulation model is less than a number of transitions of the clock signal between the high state and the low state in the non-simulated of the electronic circuit.

2. The method of claim 1, wherein simulating the charge pump macro model comprises:
simulating the behavioral block based on the modeling language; and
simulating the output terminal based on an output of the behavioral block and a value of the at least one passive device.

3. The method of claim 1, wherein the modeling language is one of Very High Speed Integrated Circuits Hardware Description Language-Analog Mixed Signal (VHDL-AMS), Verilog-AMS, and Verilog-A.

4. The method of claim 1, wherein the behavioral block comprises:
a voltage multiplier configured to generate a second voltage that is N times as high as a first voltage corresponding to an input voltage of the :N-stage charge pump; and
a switching unit configured to connect the voltage multiplier to the passive device block or disconnect the voltage multiplier from the passive device block in response to a control signal received through the enable terminal.

5. The method of claim 4, wherein the switching unit comprises:
a filter configured to filter the control signal; and
a switch configured to connect the voltage multiplier to the passive device block or disconnect the voltage multiplier from the passive device block in response to the filtered control signal.

6. The method of claim 4,
wherein the electronic circuit comprises a regulator configured to generate the feedback signal for controlling the charge pump macro model based on a reference voltage and an output voltage output from the output terminal.

7. The method of claim 1, wherein generating the charge pump macro model comprises;
determining a capacitance of the adjustment capacitor based on a capacitance of a capacitor included in a single stage of the N-stage charge pump.

8. The method of claim 7, wherein the capacitance of the adjustment capacitor is equal to $(N \times C)/3$,
wherein C is the capacitance of the capacitor included in the single stage of the N-stage charge pump.

9. The method of claim 7, further comprising:
comparing first result data obtained by simulating the charge pump macro model with second result data obtained by simulating the N-stage charge pump; and
adjusting the capacitance of the adjustment capacitor based on a result of comparing the first result data with the second result data.

10. The method of claim 1, wherein generating the charge pump macro model comprises:
receiving a number of stages of the N-stage charge pump, a frequency of the clock signal input to the N-stage charge pump, and a capacitance of a capacitor included in a single stage of the N-stage charge pump from a user.

11. The method of claim 1, wherein the electronic circuit is a nonvolatile memory device comprising the N-stage charge pump.

12. A computer program product for a method of simulating an electronic circuit comprising an N-stage charge pump, the computer program product comprising a non-transitory computer-readable storage medium having program instructions embodied therewith, the program instructions executable by a processor to cause the processor to:
generate a charge pump macro model corresponding to the N-stage charge pump, wherein M is an integer greater than or equal to 1, wherein generating the charge pump macro model comprises determining a resistance of the equivalent resistor based on a frequency of the clock signal input to the N-stage charge pump and a capacitance of a capacitor included in a single stage of the N-stage charge pump, wherein the resistance of the equivalent resistor is equal to $(a \times N)/(2f \times C)$, wherein a is a constant that is larger than 0 and equal to or less than 1, f is the frequency of the clock signal, and C is the capacitance of the capacitor included in the single stage of the N-stage charge pump;
simulate the charge pump macro model, wherein the charge pump macro model comprises:
an enable terminal;
an output terminal;
a behavioral block defined by a modeling language; and
a passive device block comprising at least one passive device connected to the output terminal and the behavioral block, wherein the passive device block comprises an equivalent resistor having one end connected to the output terminal and another end to which an output of the behavioral block is applied; and an adjustment capacitor connected between the output terminal and a ground voltage,
wherein a feedback signal is input to the enable terminal of the charge pump macro model in a simulation model simulating the electronic circuit and a clock signal is input to the N-stage charge pump in a non-simulated operation of the electronic circuit; and
control the charge pump macro model in response to the feedback signal in the simulation model, wherein the N-stage charge pump is controlled in response to the clock signal between the high state and the low state in the non-simulated operation of the electronic circuit.

13. A method of simulating an electronic circuit comprising an N-stage charge pump, the method comprising:
generating a charge pump macro model in a simulation model simulating the electronic circuit, wherein the charge pump macro model corresponds to the N-stage charge pump in the electronic circuit, N is an integer greater than or equal to 1, wherein generating the charge pump macro model comprises determining a resistance of the equivalent resistor based on a frequency of the clock signal input to the N-stage charge pump and a capacitance of a capacitor included in a single stage of the N-stage charge pump, wherein the resistance of the equivalent resistor is equal to $(a \times N)/(2f \times C)$, wherein a is a constant that is larger than 0 and equal to or less than 1, f is the frequency of the clock signal, and C is the capacitance of the capacitor included in the single stage of the N-stage charge pump, and the charge pump macro model comprises:
an enable terminal;
an output terminal;
an adjustment capacitor connected between the output terminal and a ground voltage;
an equivalent resistor having a first end connected to the output terminal;

a behavioral block defined by a modeling language and comprising a voltage multiplier configured to generate a second voltage that is N times as high as a first voltage corresponding to an input voltage of the N-stage charge pump; and a switching unit configured to connect the voltage multiplier to a second end of the equivalent resistor or disconnect the voltage multiplier from the second end of the equivalent resistor in response to a control signal received through the enable terminal, a passive device block comprising at least one passive device connected to the output terminal and the behavioral block, wherein the passive device block comprises an equivalent resistor having one end connected to the output terminal and another end to which an output of the behavioral block is applied; and an adjustment capacitor connected between the output terminal and a ground voltage, wherein a feedback signal is in put to the enable terminal of the charge pump macro model in the simulation model simulating the electronic circuit, and a clock signal is input to the N-stage charge pump in a non-simulated operation of the electronic circuit, and controlling the charge pump macro model in response to the feedback signal in the simulation model, wherein the N-stage charge pump is controlled in response to the clock signal between the high state and the low state in the non-simulated operation of the electronic circuit, wherein a number of transitions of the feedback signal between a high state and a low state in the simulation model is less than a number of transitions of the clock signal between the high state and the low state in the non-simulated operation of the electronic circuit.

14. The method of claim 13, wherein generating the charge pump macro model comprises:

defining operations of the voltage multiplier and the switching unit using a modeling language.

15. The method of claim 14, further comprising:

simulating the voltage multiplier and the switching unit based on the modeling language; and simulating the output terminal based on an output of the switching unit, a resistance of the equivalent resistor, and a capacitance of the adjustment capacitor.

16. The method of claim 13, wherein generating the charge pump macro model comprises:

determining a resistance of the equivalent resistor based on a frequency of a clock signal input to the N-stage charge pump and a capacitance of a capacitor included in a single stage of the N-stage charge pump.

17. A computer system, comprising:

a processor; and a memory configured to store program instructions executable by the processor to cause the processor to simulate an electronic circuit comprising an N-stage charge pump by:

generating a charge pump macro model in a simulation model simulating the electronic circuit, wherein the charge pump macro model corresponds to the N-stage charge pump in the electronic circuit, N is an integer greater than or equal to 1, wherein generating the charge pump macro model comprises determining a resistance of the equivalent resistor based on a frequency of the clock signal input to the N-stage charge pump and a capacitance of a capacitor included in a single stage of the N-stage charge pump, wherein the resistance of the equivalent resistor is equal to $(a \times N)/(2f \times C)$, wherein a is a constant that is larger than 0 and equal to or less than 1, f is the frequency of the clock signal, and C is the capacitance of the capacitor included in the single stage of the N-stage charge pump, and the charge pump macro model comprises:

an enable terminal;

an output terminal;

an adjustment capacitor connected between the output terminal and a ground voltage;

an equivalent resistor having a first end connected to the output terminal;

a behavioral block defined by a modeling language and comprising a voltage multiplier configured to generate a second voltage that is N times as high as a first voltage corresponding to an input voltage of the N-stage charge pump; and a switching unit configured to connect the voltage multiplier to a second end of the equivalent resistor or disconnect the voltage multiplier from the second end of the equivalent resistor in response to a control signal received through the enable terminal, a passive device block comprising at least one passive device connected to the output terminal and the behavioral block, wherein the passive device block comprises an equivalent resistor having one end connected to the output terminal and another end to which an output of the behavioral block is applied; and an adjustment capacitor connected between the output terminal and a ground voltage, wherein a feedback signal is input to the enable terminal of the charge pump macro model in the simulation model simulating the electronic circuit, and a clock signal is input to the N-stage charge pump in a non-simulated operation of the electronic circuit; and controlling the charge pump macro model in response to the feedback signal in the simulation model, wherein the N-stage charge pump is controlled in response to the clock signal between the high state and the low state in the non-simulated operation of the electronic circuit, wherein a number of transitions of the feedback signal between a high state and a low state in the simulation model is less than a number of transitions of the clock signal between the high state and the low state in the non-simulated operation of the electronic circuit.

* * * * *